United States Patent
He et al.

(10) Patent No.: US 8,957,478 B2
(45) Date of Patent: Feb. 17, 2015

(54) SEMICONDUCTOR DEVICE INCLUDING SOURCE/DRAIN FORMED ON BULK AND GATE CHANNEL FORMED ON OXIDE LAYER

(71) Applicant: International Business Machines Corporation, Armonk, NY (US)

(72) Inventors: Hong He, Schenectady, NY (US); Chiahsun Tseng, Wynantskill, NY (US); Junli Wang, Singerlands, NY (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/925,105

(22) Filed: Jun. 24, 2013

(65) Prior Publication Data
US 2014/0374839 A1    Dec. 25, 2014

(51) Int. Cl.
*H01L 29/66*    (2006.01)
*H01L 27/088*    (2006.01)

(52) U.S. Cl.
CPC ...... *H01L 27/0886* (2013.01); *H01L 29/66795* (2013.01)
USPC ............ 257/365; 257/192; 257/401; 438/151

(58) Field of Classification Search
USPC .......................... 257/192, 365, 401; 438/151
See application file for complete search history.

(56) References Cited

U.S. PATENT DOCUMENTS

| | | | |
|---|---|---|---|
| 6,972,461 B1 | 12/2005 | Chen et al. | |
| 7,268,024 B2 * | 9/2007 | Yeo et al. | 438/151 |
| 7,365,401 B2 | 4/2008 | Anderson et al. | |
| 7,642,589 B2 | 1/2010 | Son et al. | |
| 7,755,104 B2 * | 7/2010 | Yagishita | 257/192 |
| 8,685,847 B2 | 4/2014 | Majumdar et al. | |
| 2005/0124099 A1 | 6/2005 | Beintner et al. | |
| 2005/0124101 A1 | 6/2005 | Beintner | |
| 2006/0084212 A1 | 4/2006 | Anderson et al. | |
| 2006/0249779 A1 | 11/2006 | Choi et al. | |
| 2007/0080387 A1 | 4/2007 | Liu et al. | |
| 2008/0029828 A1 | 2/2008 | Oh et al. | |
| 2008/0099850 A1 | 5/2008 | Jeon et al. | |
| 2008/0142841 A1 | 6/2008 | Lindert et al. | |
| 2008/0265290 A1 | 10/2008 | Nielsen et al. | |
| 2009/0134463 A1 | 5/2009 | Abadeer et al. | |
| 2009/0267155 A1 * | 10/2009 | Izumida et al. | 257/365 |
| 2010/0308381 A1 | 12/2010 | Luning et al. | |

(Continued)

OTHER PUBLICATIONS

International Search Report for corresponding PCT Application No. PCT/US2014/038108, dated Sep. 11, 2014, pp. 1-7.

(Continued)

*Primary Examiner* — Tom Thomas
*Assistant Examiner* — Vincent Wall
(74) *Attorney, Agent, or Firm* — Cantor Colburn LLP; Vazken Alexanian

(57) ABSTRACT

A semiconductor device having a doped well area includes a doped substrate layer formed on a substrate portion of the semiconductor device. The doped substrate layer extends along a first direction to define a length and a second direction perpendicular to the first direction to define a width. A plurality of fins is formed on the doped substrate layer and an oxide substrate layer is formed between each fin. At least one gate is formed on the oxide substrate layer and extends across at least one fin among the plurality of fins.

3 Claims, 28 Drawing Sheets

(56) References Cited

U.S. PATENT DOCUMENTS

| | | |
|---|---|---|
| 2011/0147842 A1 | 6/2011 | Cappellani et al. |
| 2011/0241073 A1 | 10/2011 | Cohen et al. |
| 2011/0309333 A1 | 12/2011 | Cheng et al. |
| 2012/0193712 A1 | 8/2012 | Bryant et al. |
| 2012/0306002 A1 | 12/2012 | Yeh et al. |
| 2013/0056826 A1 | 3/2013 | Liu et al. |

OTHER PUBLICATIONS

Written Opinion for corresponding PCT Application No. PCT/US2014/038108, dated Sep. 11, 2014, pp. 1-9.

* cited by examiner

SEMICONDUCTOR DEVICE INCLUDING SOURCE/DRAIN FORMED ON BULK AND GATE CHANNEL FORMED ON OXIDE LAYER

BACKGROUND

The invention relates to a semiconductor device, and more particularly, to patterning fins of a FinFET semiconductor device.

Interests in multi-gate MOSFETs have significantly increased as the industry continues to demand smaller sized MOSFET devices. One such device that is capable of maintaining industry performance standards at a reduced size is the FinFET.

A conventional FinFET includes one or more fins that are patterned on a substrate, such as a silicon-on-insulator (SOI) substrate. For example, a conventional sidewall image transfer (SIT) process can be used to form a dense array of fins surrounded by silicon oxide layer, and a dummy gate patterning process is performed for forming a gate after forming the fins. Conventional FinFET fabrication processes perform a silicon (Si) epitaxial (epi) merging process to merge the fins after forming the dummy gate. However, the selective epi Si growth process is difficult to control and hence is unstable. The control difficulties typically cause the epi Si to grow at different thicknesses on individual fins of the same wafer or between processing runs of different wafers. Thus, this inconsistent growth can result in the epi Si being inconsistently thicker or thinner.

SUMMARY

According to an exemplary embodiment, a semiconductor device having a doped well area includes a doped substrate layer formed on a substrate portion of the semiconductor device. The doped substrate layer extends along a first direction to define a length and a second direction perpendicular to the first direction to define a width. A plurality of fins is formed on the doped substrate layer and an oxide substrate layer is formed between each fin. At least one gate is formed on the oxide substrate layer and extends across at least one fin among the plurality of fins.

In another exemplary embodiment, a method of forming a semiconductor device comprises forming at least one fin on a doped bulk substrate region of a semiconductor substrate. The method further comprise forming a buried oxide layer on the doped bulk substrate region to surround the at least one fin. The buried oxide layer has a first source/drain region and a second source/drain region. The method further comprises forming at least one gate stack on the buried oxide layer, and etching the first and second source/drain areas to expose respective first and second doped bulk substrate regions. The method further comprises forming a first source/drain element at the first doped bulk substrate region and forming a second source/drain element at the second doped bulk substrate region.

In still another exemplary embodiment, a method of forming a semiconductor device comprises forming a well region in a substrate, and doping the well region with ions having a first polarity to form a doped bulk substrate region. The method further comprises forming at least one fin on the doped bulk substrate region. The method further comprises depositing an oxide material that covers exposed portions of the doped bulk substrate region and a portion of the at least one fin to form a buried oxide layer. The buried oxide layer has a first source/drain region and a second source/drain region. The method further comprises forming on the buried oxide layer at least one gate stack that extends between the first source/drain region and the second source/drain region.

Additional features and utilities are realized through the techniques of the present invention. Other exemplary embodiments and features are described in detail herein and are considered a part of the claimed embodiments. For a more detailed description of the invention and features, drawings and descriptions of the exemplary embodiments are presented below.

BRIEF DESCRIPTION OF THE SEVERAL VIEWS OF THE DRAWINGS

The subject matter describing exemplary embodiments is particularly pointed out and distinctly claimed in the claims at the conclusion of the specification. The forgoing and other features, and utilities are apparent from the following detailed description taken in conjunction with the accompanying drawings in which:

FIGS. 1A-27C are a series of views illustrating a method of forming a finFET device according to exemplary embodiments in which:

FIG. 1A is a top view illustrating a resist layer formed atop a starting substrate;

FIG. 3 illustrates the substrate of FIG. 2B after removing the resist layer and performing and additional etching process to partially etch the masking layer to form a well extending into a bulk portion of the substrate;

FIG. 27C is a cross-sectional view taken along line C-C' of the substrate illustrated in FIG. 27A.

DETAILED DESCRIPTION

Figure 1A:
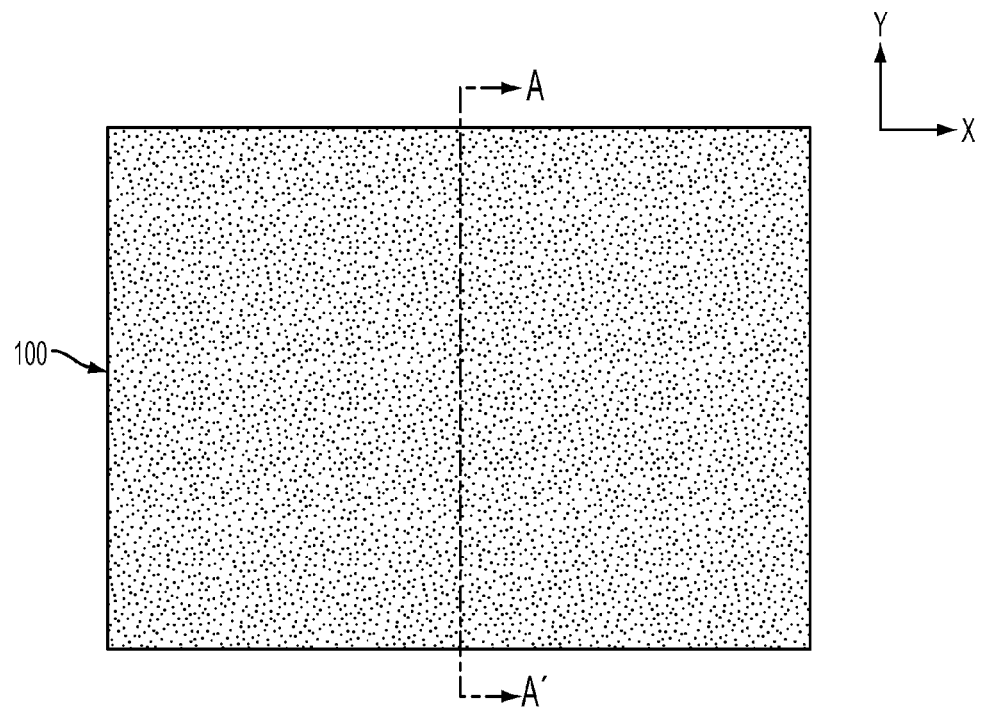
Figure 1B:
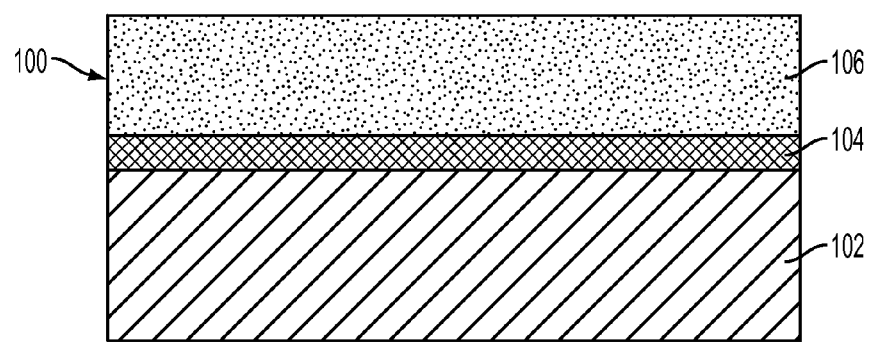
FIG. 1B is a cross sectional view of the starting substrate illustrated in FIG. 1A taken along the line A-A' illustrating the formation of the resist layer atop a masking layer.

FIGS. 1A-1B illustrate a semiconductor structure 100 according to an exemplary embodiment. The semiconductor structure 100 includes a substrate 102, such as a semiconductor substrate 102, a masking layer 104 and a resist layer 106. The semiconductor substrate 102 may extend along an X-axis to define a length, and a Y-axis perpendicular to the X-axis to define a width. In addition, the semiconductor substrate 102 may be formed from various semiconductor materials. For example, the semiconductor substrate 102 may be formed from silicon (Si), germanium (Ge), silicon germanium (SiGe), silicon carbide (SiC), or a III-V compound semiconductor (e.g., GaAs), and a II-VI compound semiconductors (e.g., ZnSe). In addition, an entire semiconductor substrate 102, or a portion thereof, may be amorphous, polycrystalline, or single-crystalline. The aforementioned types of semiconductor substrates 102 may also include a hybrid oriented (HOT) semiconductor substrate, which provides surface regions of different crystallographic orientation. The semiconductor substrate 102 may be doped, undoped or contain doped regions and undoped regions therein. Further, the semiconductor substrate 102 may be strained, unstrained, contain regions of strain and no strain therein, or contain regions of tensile strain and compressive strain.

The masking layer 104 is formed on an upper surface of the semiconductor substrate 102 to provide a hardmask or covering. The masking layer 104 may be made of a dielectric including, but not limited to, (SiO$_2$), and silicon nitride (SiN). The thickness of the masking layer 104 is approximately 40 nanometers (nm).

The resist layer 106 is formed on an upper surface of the masking layer 104 such that the masking layer 104 is formed between the semiconductor substrate 102 and the resist layer 106. The resist layer 106 may be made of a light-sensitive material that forms a photoresist layer, which may be patterned according to well-known photolithography processes. The resist layer 106 is not limited to a particular amount of layers. For example, the resist layer 106 may be formed as a single layer resist layer, or may be formed as a tri-layer resist.

FIGS. 2A-26C illustrate a flow process of forming a semiconductor structure 100, such as a FinFET device, according to an exemplary embodiment. Although an nFET device will described in the illustrated embodiments hereinafter, a pFET device may also be formed using similar processes as would be appreciated by one of ordinary skill in the art. Additionally, a semiconductor structure 100 may be formed having a plurality of different FET portions. For example, a semiconductor structure 100 may be formed that includes both an nFET portion and a pFET portion.

Figure 2A:
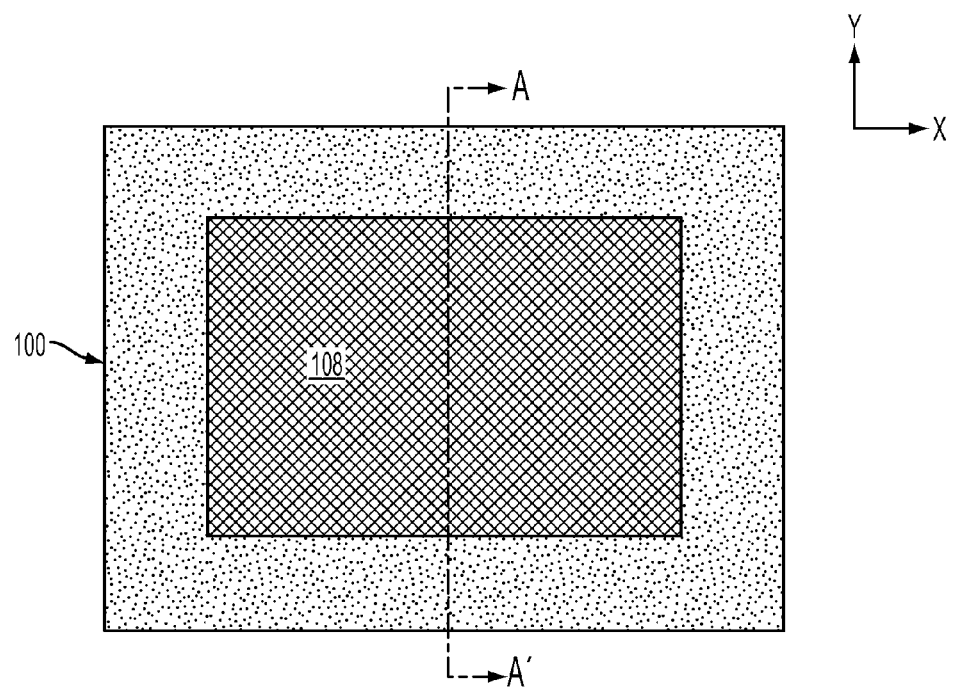
FIG. 2A is a top view of the substrate illustrated FIG. 1 after partially etching the resist layer to form a void that exposes the masking layer.
Figure 2B:
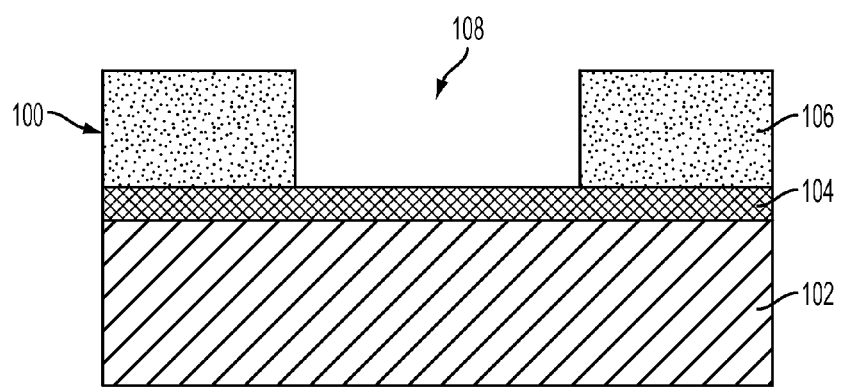
FIG. 2B is a cross-section view of the substrate illustrated in FIG. 2A taken along line A-A'.

Referring to FIGS. 2A-2B, the resist layer 106 is patterned according to a lithography process, such as a photolithography process, to form a void 108 therein. Accordingly, the void 108 exposes the underlying masking layer 104, while leaving portions of the resist layer 106 surrounding the void 108.

Figure 3:
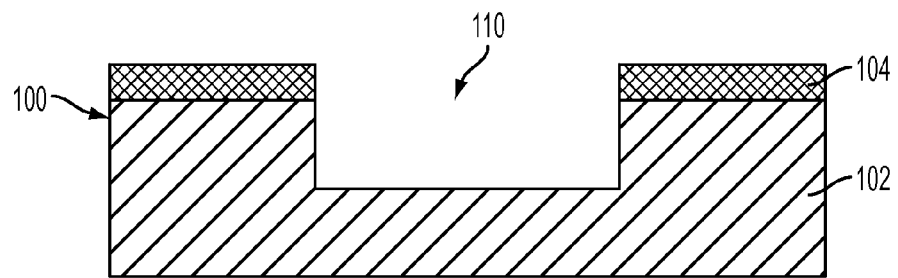

Referring to FIG. 3, the void 108 is further recessed to form an nFET well 110 in the semiconductor substrate 102. More specifically, the masking layer 104 exposed by the void 108 may be etched away, and the void 108 may be extended further into the semiconductor substrate 102 to form the nFET well 110 to expose a portion of the semiconductor substrate 102'. The height of the nFET well 110, i.e., the distance between the exposed semiconductor substrate 102 and the upper surface of the masking layer 104 may range from approximately 20 nm to approximately 50 nm. Various etchings process may be used to form the nFET well 110 including, but not limited to, a plasma etching process. After forming the nFET well 110, the remaining portions of the resist layer 106 may be removed as further illustrated in FIG. 3.

Figure 4A:
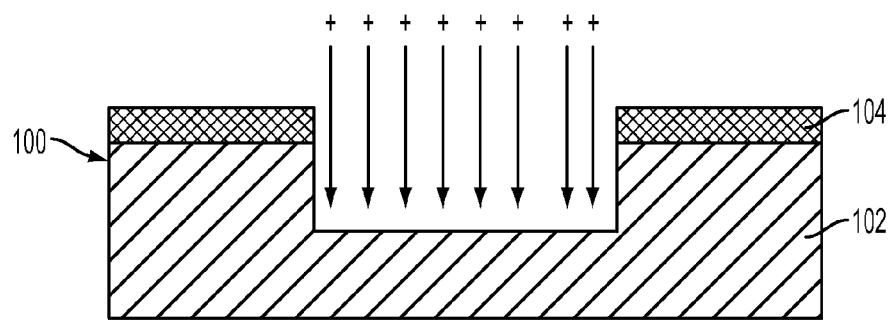
FIG. 4A illustrates an ion implantation operation to implant ions in the well shown in FIG. 3.
Figure 4B:
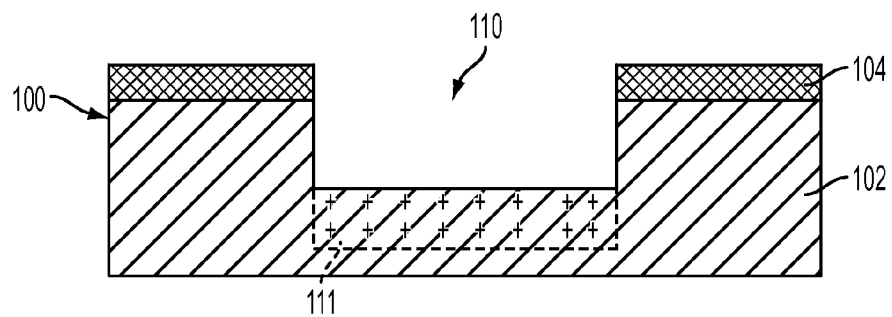
FIG. 4B illustrates the substrate of FIG. 4A having a doped substrate region following the ion implantation operation.

Referring now to FIG. 4A, ions having a first polarity, e.g., positive ions (+), are implanted in the nFET well 110. The positive ions (+) may be implanted using various ion implantation processes (IIP) understood by those of ordinary skill in the art. Turing to FIG. 4B, a doped substrate area 111, for example a P+ doped well area 111, is formed at the exposed semiconductor substrate 102 in response to implanting the ions. It is appreciated that the P+ doped well area 111 may be an N− doped well area in an embodiment where a pFET device is formed.

Figure 5A:
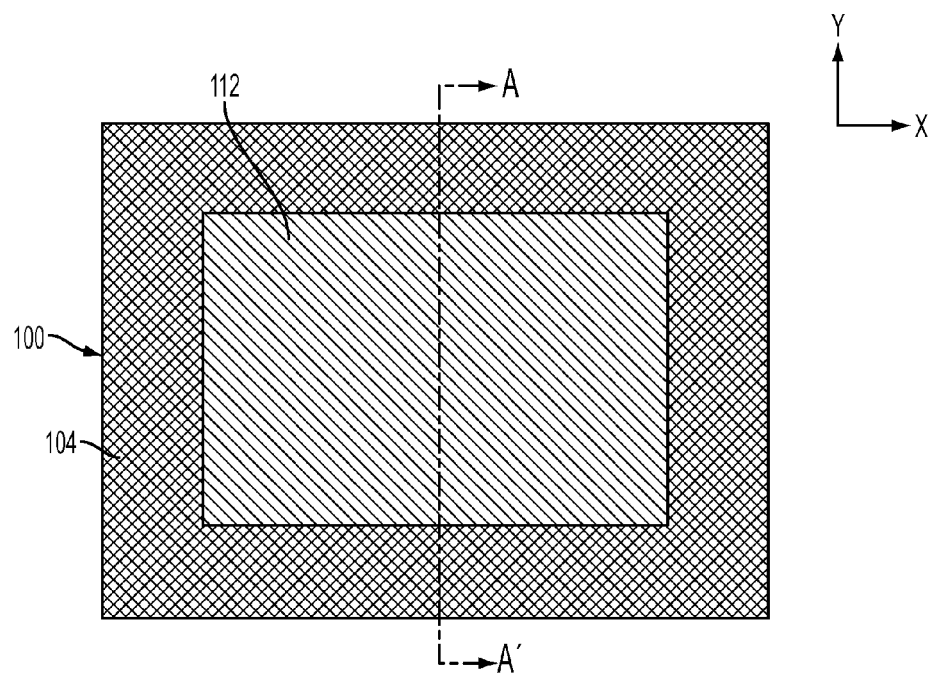
FIG. 5A is a top view of the substrate illustrated in FIG. 4B after forming a sacrificial layer on the doped substrate region.
Figure 5B:
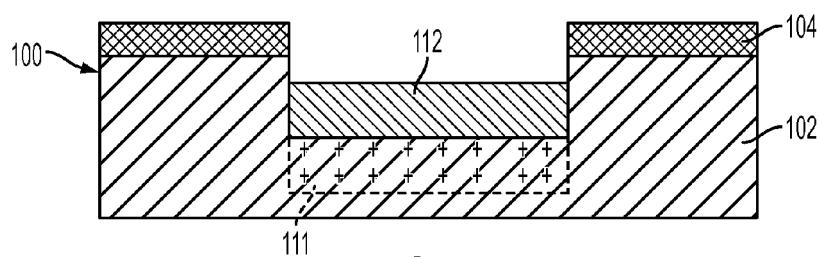
FIG. 5B is a cross-sectional view taken along line A-A' of the substrate illustrated in FIG. 5A.
Figure 6A:
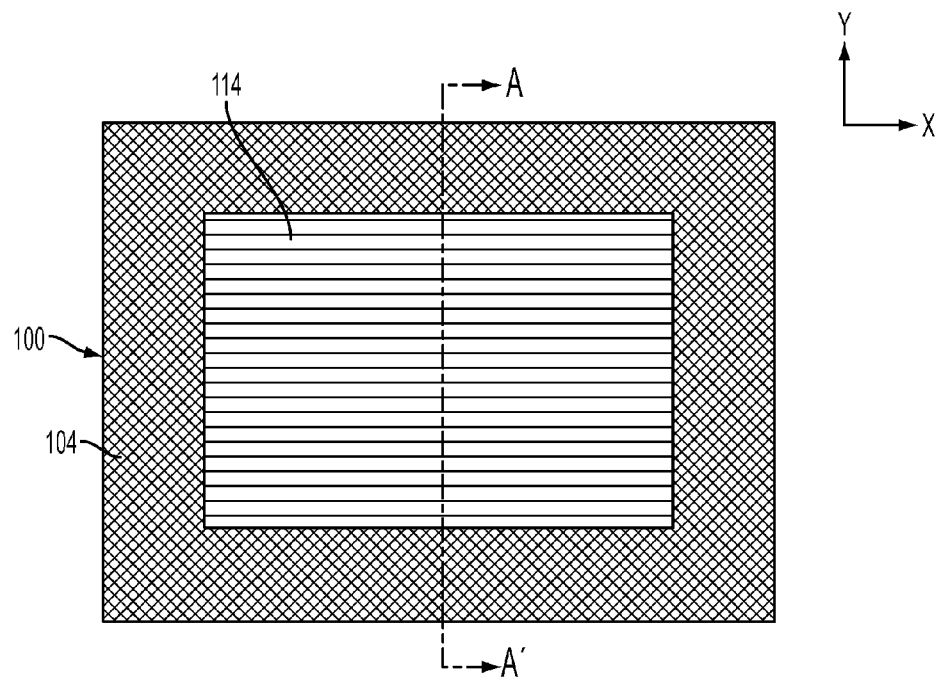
FIG. 6A is a top view of the substrate illustrated in FIGS. 5A-5B after forming an active semiconductor layer on the sacrificial layer.
Figure 6B:
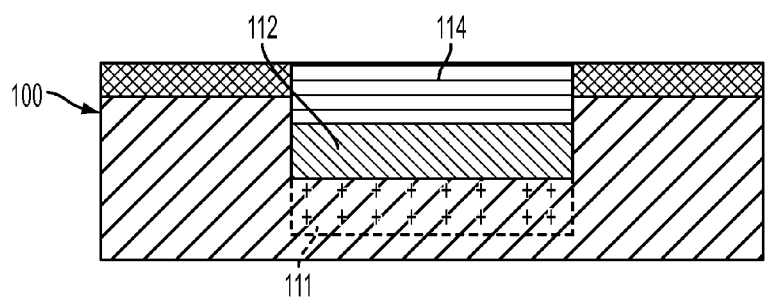
FIG. 6B is a cross-sectional view taken along line A-A' of the substrate illustrated in FIG. 6A.

Turning now to FIGS. 5A-5B, a sacrificial layer 112 is formed on the P+ doped well area 111. In at least one embodiment, the sacrificial layer 112 is formed by epitaxially growing a layer of single crystal silicon germanium (SiGe) from the P+ doped well area 111, such that the sacrificial layer is a sacrificial SiGe epi layer. A second epitaxial process may also be performed to form an epitaxial Si layer 114 on an upper surface of the sacrificial oxide layer 112 as illustrated in FIGS. 6A-6B. Accordingly, the sacrificial oxide layer 112 is interposed between the doped substrate area 111 and the epitaxial Si layer 114. In at least one embodiment, the epitaxial Si layer 114 is grown as a single crystal epitaxial Si.

Referring now to FIGS. 7A-13B, a process flow, such as a sidewall image transfer (SIT) process for example, to form one or more semiconductor fins on the semiconductor substrate 102 is illustrated.

Figure 7A:
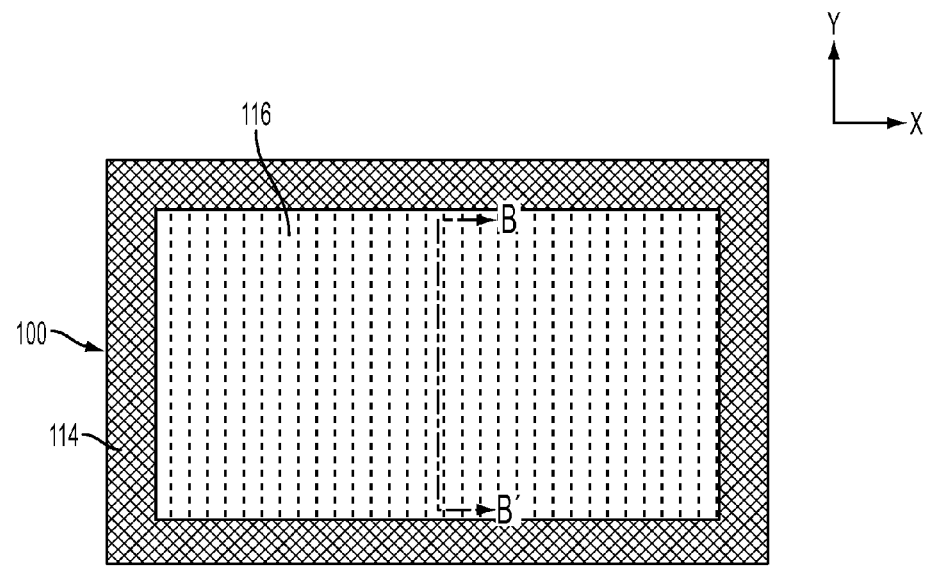
FIG. 7A is atop view of the substrate illustrated in FIGS. 6A-6B showing a mandrel layer formed on an upper surface of the active semiconductor layer.
Figure 7B:
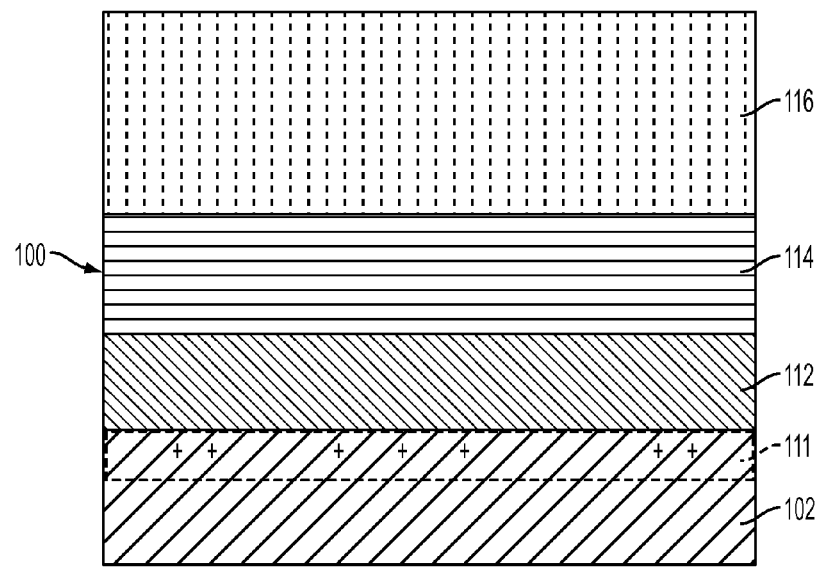
FIG. 7B is a cross-sectional view taken along line B-B' of the substrate illustrated in FIG. 7A.

More specifically, FIG. 7A illustrates a top view of the substrate 102. A mandrel layer 116 is formed on an upper surface of the epitaxial Si layer 114 in the area previous etched to form the void 108. FIG. 7B is a cross-sectional view taken along line B-B' of the substrate 102 illustrated in FIG. 7A.

Figure 8A:
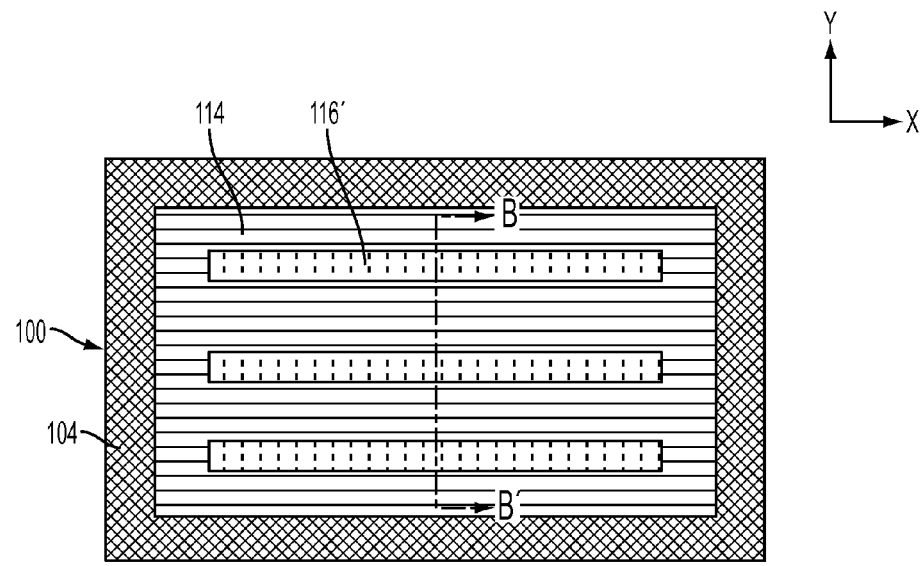
FIG. 8A is a top view of the substrate illustrated in FIGS. 7A-7B following patterning of the mandrel layer to form a plurality of individual mandrels.
Figure 8B:
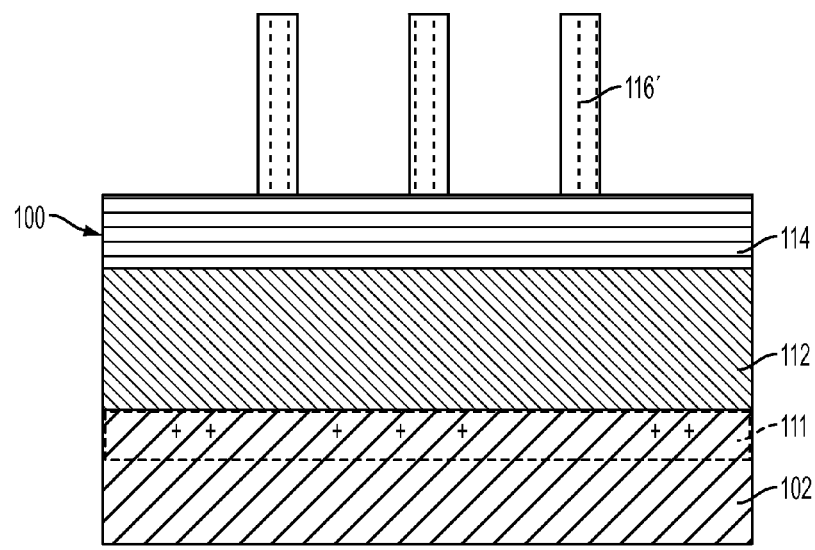
FIG. 8B is a cross-sectional view taken along line B-B' of the substrate illustrated in FIG. 8A.

Referring to FIG. 8A, the mandrel layer 116 may be patterned to form a plurality of individual mandrels 116'. The dimensions of the mandrels control the dimensions of a respective fin 118 to be formed. FIG. 8B is a cross-sectional view taken along line B-B' of the substrate 102 illustrated in FIG. 8A.

Figure 9A:
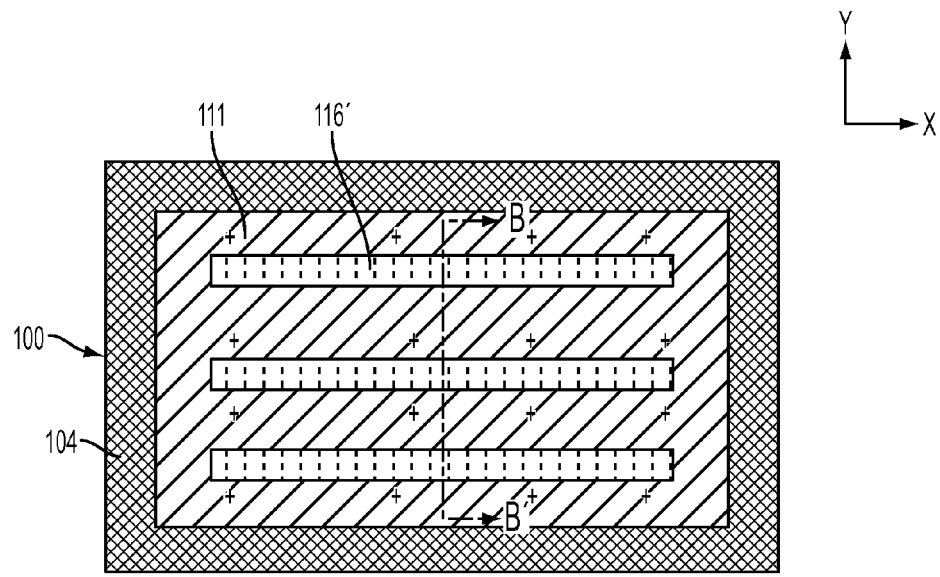
FIG. 9A is a top view of the substrate illustrated in FIGS. 8A-8B following patterning of the active semiconductor layer and the sacrificial oxide layer to define a plurality of fins and a doped substrate region surrounding the fins.
Figure 9B:
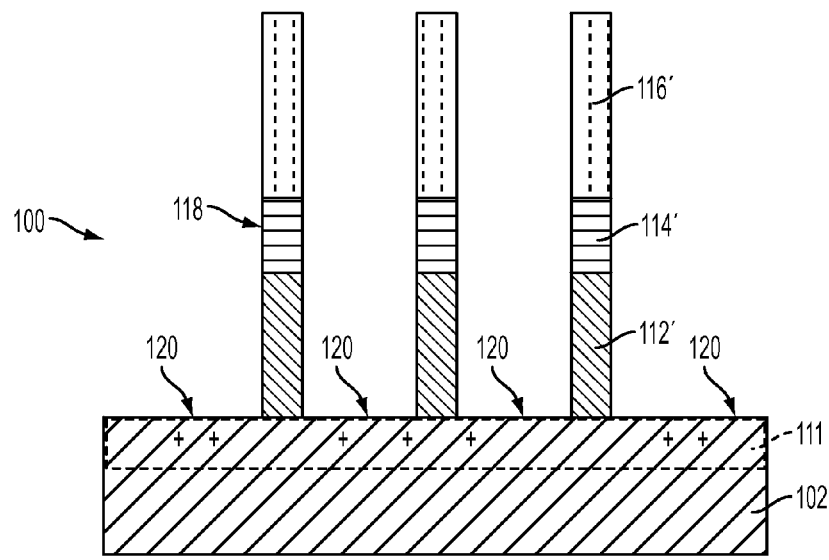
FIG. 9B is a cross-section view taken along line B-B' illustrating the substrate of FIG. 9A and showing the plurality of fins.

Turning now to FIG. 9A, the exposed epitaxial Si layer 114 (i.e., the epitaxial Si layer not covered by the mandrels) and the sacrificial oxide layer 112 beneath the epitaxial Si layer 114 are etched to form a plurality of fins 118. FIG. 9B is a cross-section view taken along line B-B' illustrating the substrate of FIG. 9A. Each fin 118 separates the P+ doped well area 111 into a respective source/drain (S/D) region 120 as further illustrated as further illustrated in FIGS. 9A-9B.

Figure 10A:
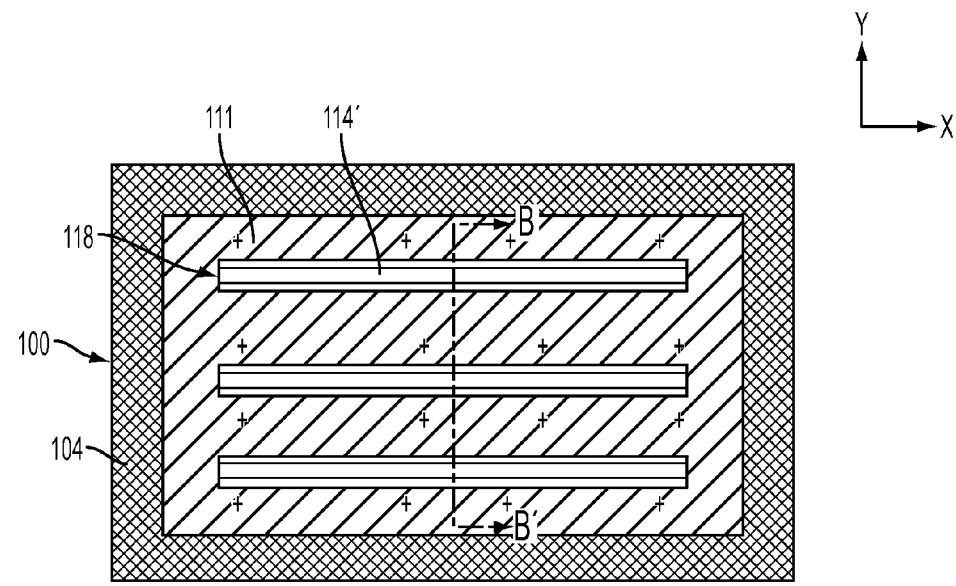
FIG. 10A is a top view of the substrate illustrated in FIGS. 9A-9B following removal of the mandrels to expose an active semiconductor fin layer of the fins.
Figure 10B:
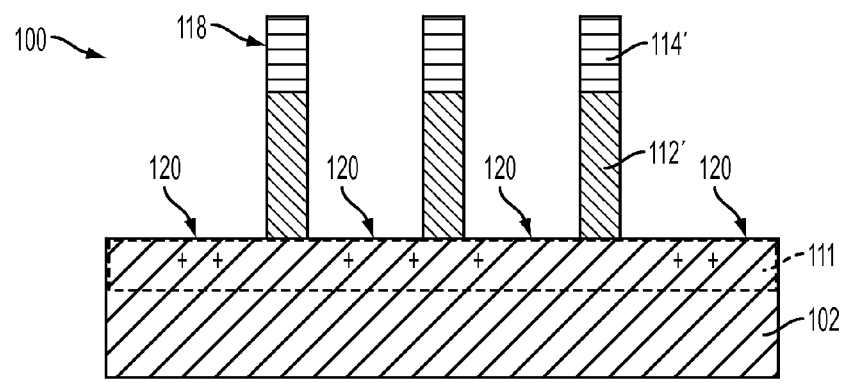
FIG. 10B is a cross-sectional view taken along line B-B' of the substrate illustrated in FIG. 10A showing the fins comprising a sacrificial oxide layer formed on the doped substrate region and the active semiconductor fin layer formed on the sacrificial oxide layer.

Referring to FIG. 10A, the mandrels are removed to provide a plurality of fins 118. FIG. 10B is a cross-sectional view taken along line B-B' of the substrate illustrated in FIG. 10A. Each of the fins 118 comprise a sacrificial oxide fin layer 112' contacting the P+ doped well area 111, and an active semiconductor fin layer, i.e., a Si fin layer 114', formed on the sacrificial oxide fin layer. According to at least one embodiment, the fin pitch between adjacent fins 118 ranges from approximately 20 nanometers (nm) to approximately 100 nm, the crucial depth (CD) ranges from approximately 6 nm to approximately 30 nm, and the fin height ranges from approximately 15 nm to approximately 150 nm. In at least one embodiment, the total fin height, which may include the sacrificial oxide layer 112 and the epitaxial Si layer 114, is approximately 100 nm.

Figure 11A:
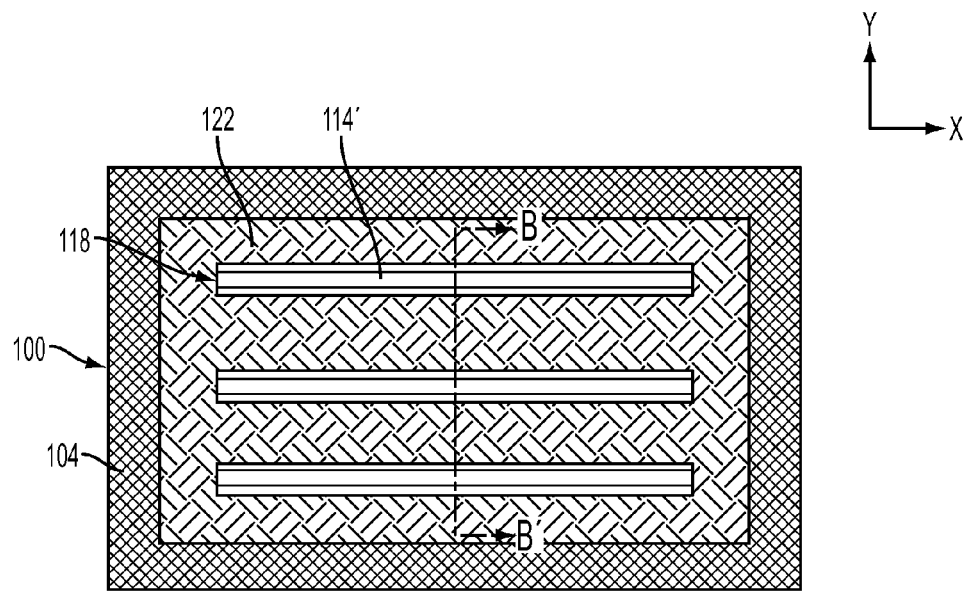
FIG. 11A is a top view of the substrate illustrated in FIGS. 10A-10B following deposition of an oxide filler on the exposed doped substrate region and around the fins.
Figure 11B:
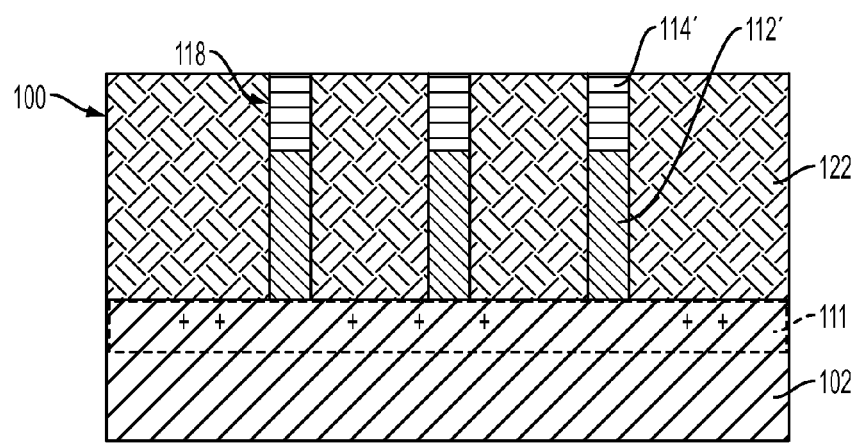
FIG. 11B is a cross-sectional view taken along line B-B' of the substrate illustrated in FIG. 11A.

Referring now to FIG. 11A, an oxide filler 122 is deposited into the spacing between the fins 118 to form an oxide substrate layer. The oxide filler 122 covers the upper surface of the S/D regions 120, and the fins 118. The oxide filler 122 may be planarized using various processes including, but not limited to, chemical-mechanical planarization (CMP) process such that the oxide filler 122 is flush with the upper surfaces of the fins, i.e., an upper portion of the Si fin layer. FIG. 11B is a cross-sectional view taken along line B-B' of the substrate illustrated in FIG. 11A.

Figure 12A:
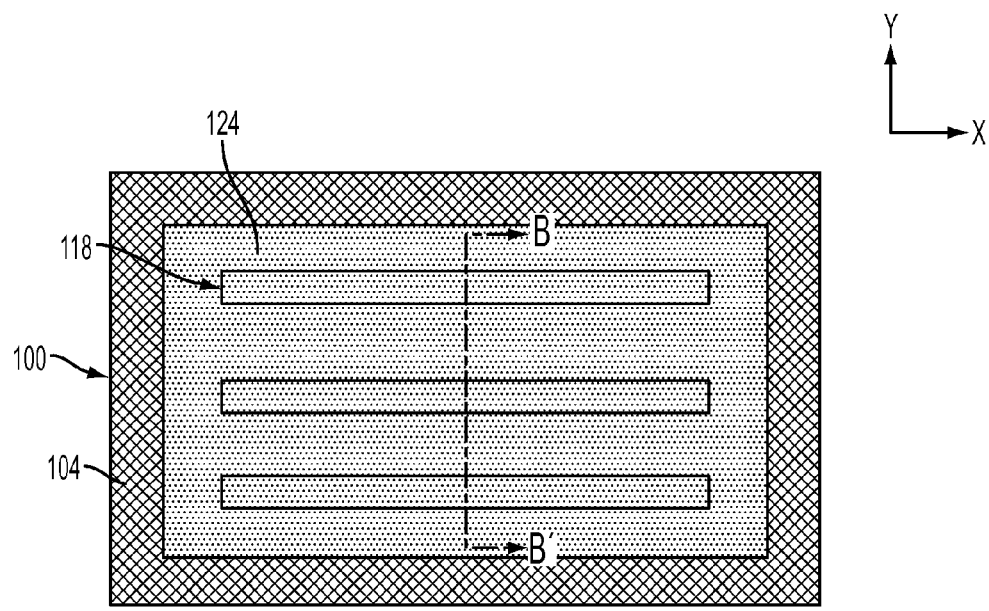
FIG. 12A is a top view of the substrate illustrated in FIGS. 11A-11B following deposition of a conformal oxide layer that covers the oxide filler and the fins.
Figure 12B:
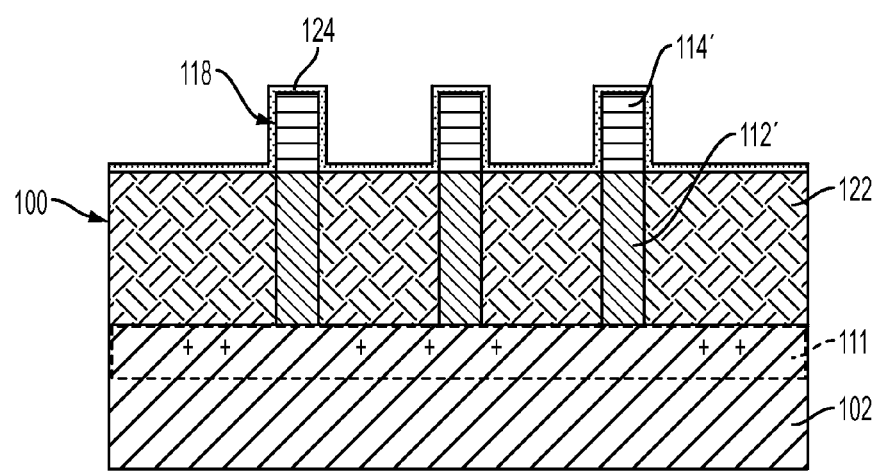
FIG. 12B is a cross-sectional view taken along line B-B' of the substrate illustrated in FIG. 12A.

Turning to FIG. 12A, the oxide filler 122 located between each fin 118 is recessed to expose an upper portion. FIG. 12B is a cross-sectional view taken along line B-B' of the substrate illustrated in FIG. 12A. In at least one embodiment, the exposed upper portion has a height ranging from approximately 20 nm to approximately 50 nm. After recessing the oxide filler 122, a thin conformal oxide layer 124 is deposited on the oxide filler 122 to cover and wrap around the exposed portion of the fins 118, as further illustrated in FIGS. 12A-12B. The conformal oxide layer 124 may be deposited using various deposition processes including, but not limited to, atomic layer deposition (ALD). The thickness of the conformal oxide layer 124 ranges from approximately 1 nm to approximately 5 nm.

Figure 13A:
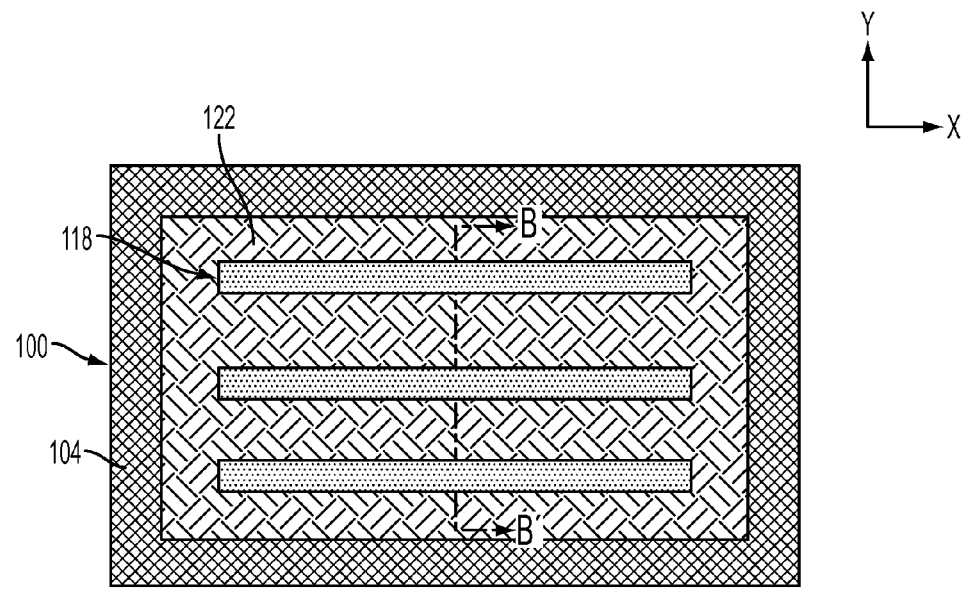
FIG. 13A is a top view of the substrate illustrated in FIGS. 12A-12B following a selective etching process that partially removes the conformal oxide layer to expose the oxide filler.
Figure 13B:
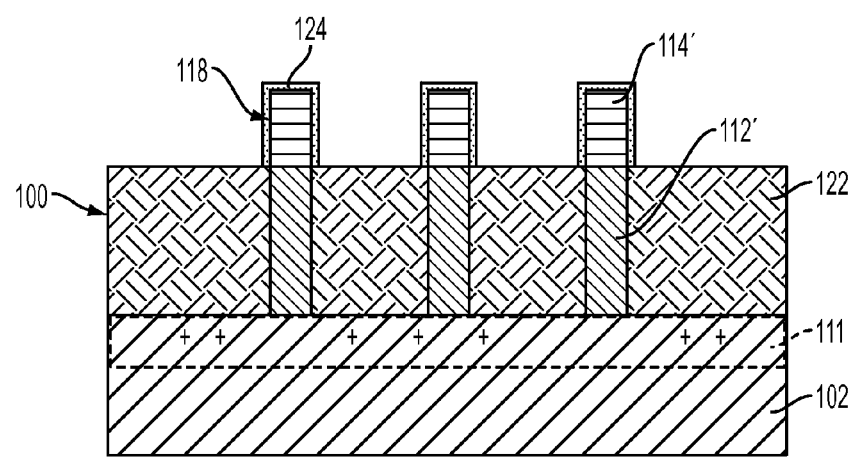
FIG. 13B is a cross-sectional view taken along line B-B' of the substrate illustrated in FIG. 13A showing the conformal oxide layer selectively removed from the oxide filler and maintained on the fins.

Turning to FIG. 13A, the conformal oxide layer 124 may be selectively etched away to expose the oxide filler 122, while leaving the conformal oxide layer 124 to cover the upper portion of the fins 118. FIG. 13B is a cross-sectional view taken along line B-B' of the substrate illustrated in FIG. 13A. Accordingly, the conformal oxide layer 124 may protect the upper portion of the fins 118.

Referring now to FIGS. 14A-18C, a process flow to form one or more gate stacks on the semiconductor substrate 102 is illustrated. The gate stacks may be formed using various processes including, but not limited to, sidewall image transfer (SIT) and pitch splitting.

Figure 14A:
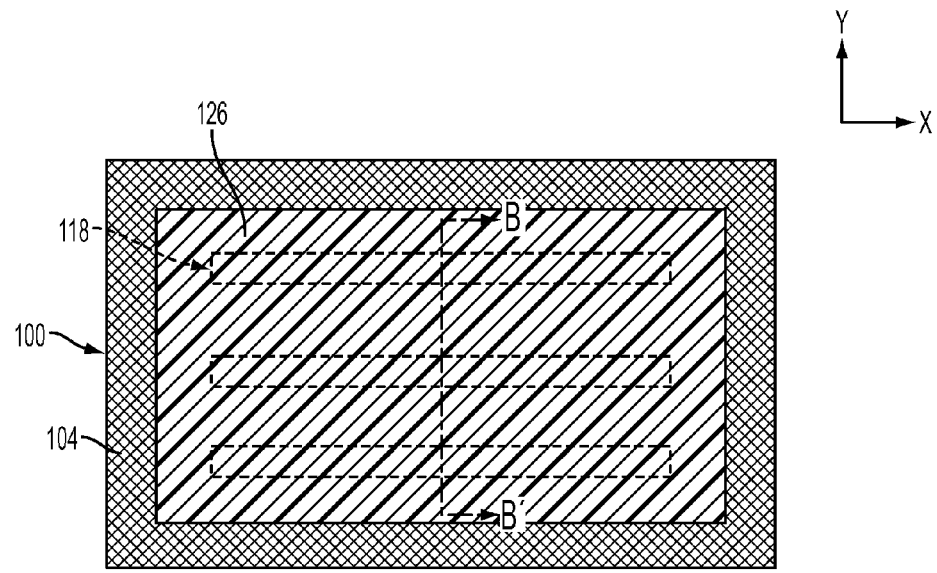
FIG. 14A is a top view of the substrate illustrated in FIGS. 13A-13B following deposition of a gate layer that covers the oxide filler and the fins.
Figure 14B:
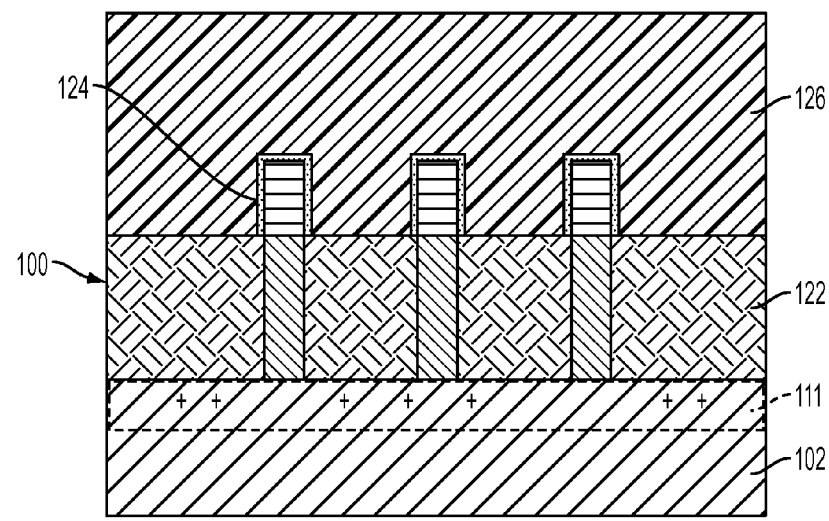
FIG. 14B is a cross-sectional view taken along line B-B' of the substrate illustrated in FIG. 14A showing the conformal oxide layer interposed between the gate layer and the active semiconductor layer of the fins.
Figure 15A:
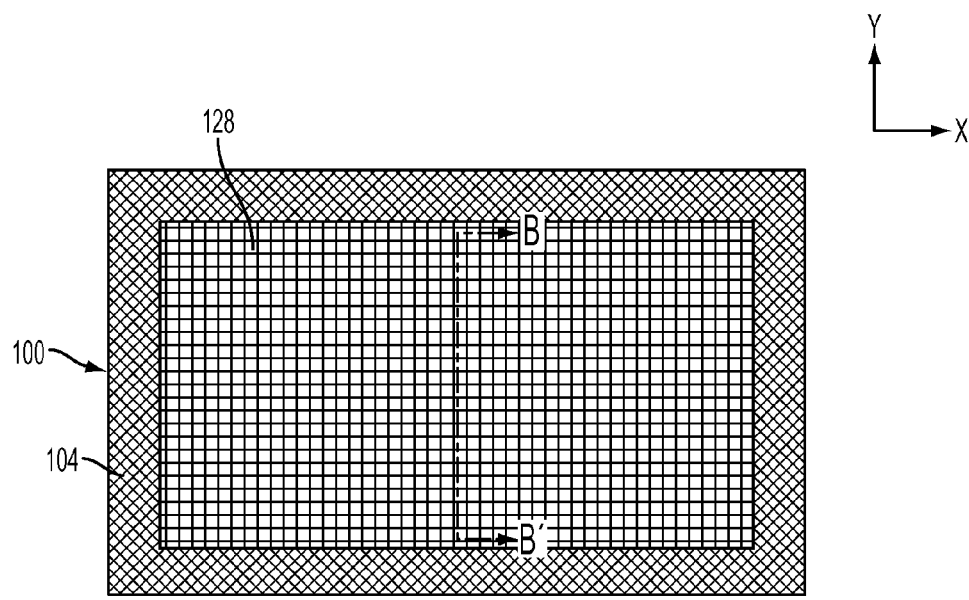
FIG. 15A is a top view of the substrate illustrated in FIGS. 14A-14B following deposition of a gate masking layer formed on an upper surface of the gate layer.
Figure 15B:
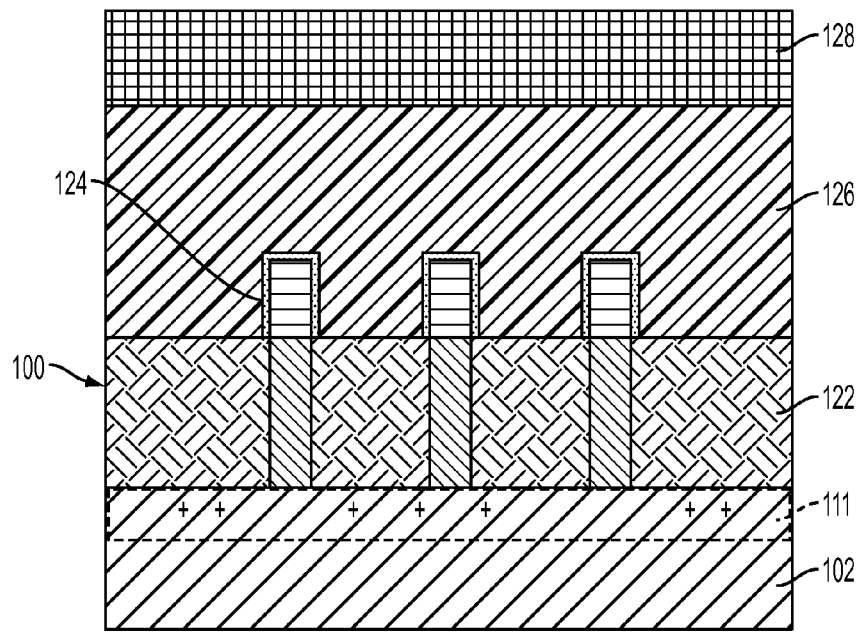
FIG. 15B is a cross-sectional view taken along B-B' of the substrate illustrated in FIG. 15A.

FIG. 14A illustrates a gate layer 126 formed on an upper surface of the exposed oxide filler 122. In at least one exemplary embodiment, the gate layer 126 may be formed from a high dielectric constant (high-k) material. However, other materials may be used. The gate layer 126 may cover the conformal oxide layer 124 to form a dummy gate as discussed in greater detail below. The gate layer 126 may be formed from polycrystalline silicon, i.e., polysilicon (PolySi). In addition, a gate masking layer 128 may be formed on an upper surface of the gate layer 126 to form a protective covering as illustrated in FIGS. 15A-15B. The gate masking layer 128 may be formed from, for example, $SiO_2$ or SiN, and may be deposited according to various deposition methods including, but not limited to, plasma enhanced chemical vapor deposition (PECVD). A cross-sectional view taken along line B-B' of the substrate 102 illustrated in FIG. 14A is illustrated in FIG. 14B.

Figure 16A:
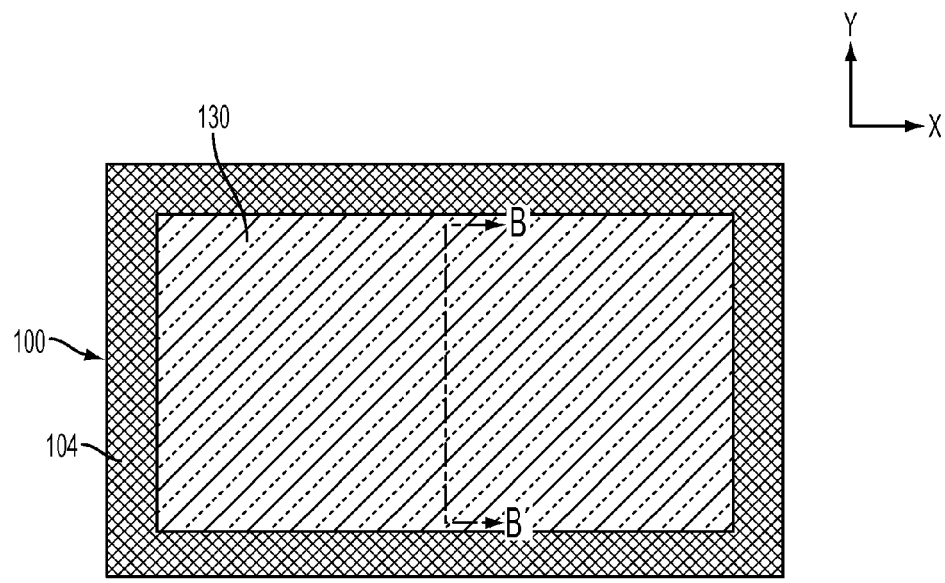
FIG. 16A is a top view of the substrate illustrated in FIGS. 15A-15B following deposition of a gate mandrel layer formed on an upper surface of the gate masking layer.
Figure 16B:
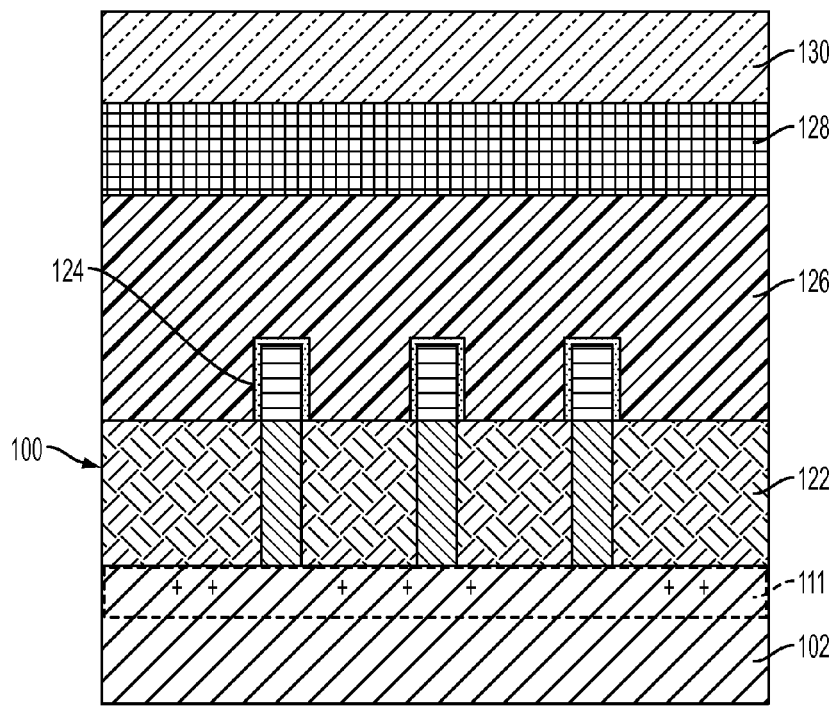
FIG. 16B is a cross-sectional view taken along B-B' of the substrate illustrated in FIG. 16A.

Turning to FIG. 16A, a gate mandrel layer 130 is formed on an upper surface of the gate masking layer 128. The gate mandrel layer 130 may be patterned to form one or gate mandrels 130' that determine the orientation and shape of a respective gate stack. FIG. 16B is a cross-sectional view taken along line B-B' of the substrate illustrated in FIG. 16A.

Figure 17A:
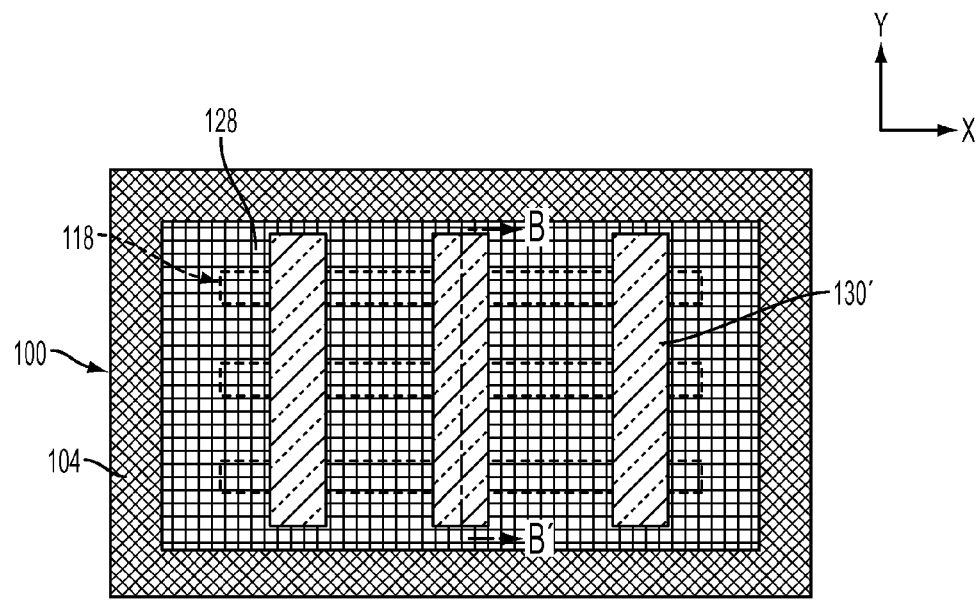
FIG. 17A is a top view of the substrate illustrated in FIGS. 16A-16B following patterning of the gate mandrel layer to define a plurality of individual gate mandrels.
Figure 17B:
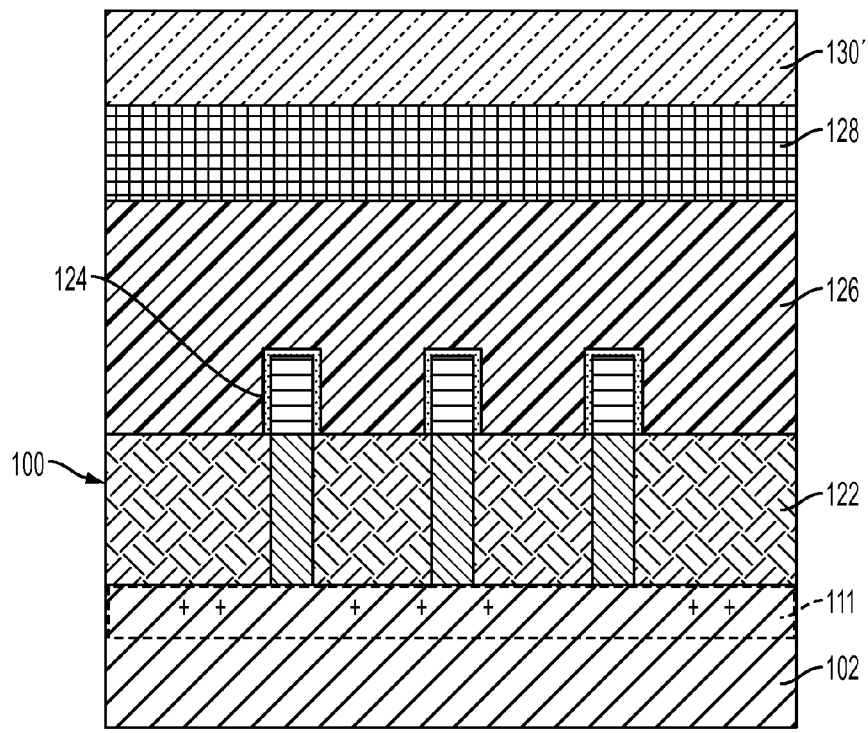
FIG. 17B is a cross-sectional view taken along line B-B' of the substrate illustrated in FIG. 17A.

Referring to FIG. 17A, the gate mandrel layer 130 may be patterned to form a plurality of gate mandrels 130' extending perpendicular with respect to the fins 118. FIG. 17B is a cross-sectional view taken along line B-B' of the substrate illustrated in FIG. 17A.

Figure 18A:
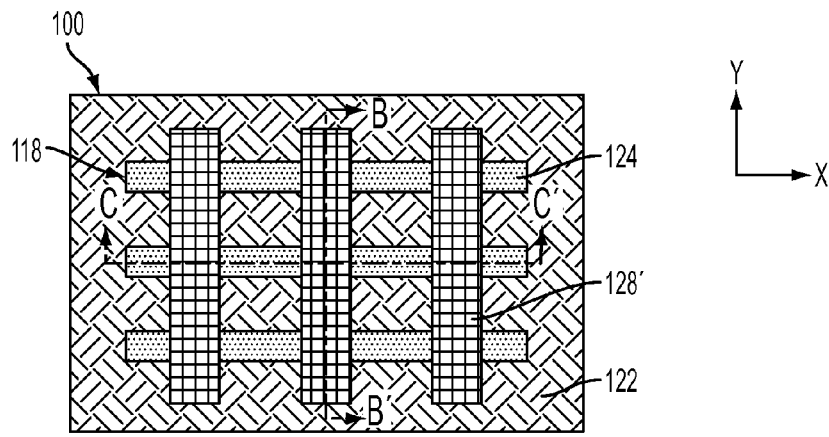
FIG. 18A is a top view of the substrate illustrated in FIGS. 17A-17B following patterning of the masking layer and the gate layer to define a plurality of gate stacks.
Figure 18B:
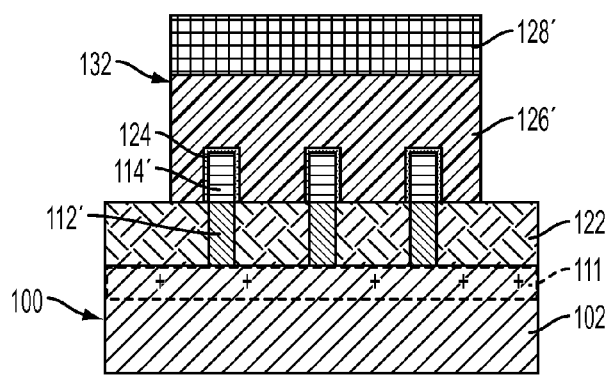
FIG. 18B is a cross-sectional view taken along line B-B' of the substrate illustrated in FIG. 18A showing a gate stack formed on the oxide filler and extending perpendicular across the fins.
Figure 18C:
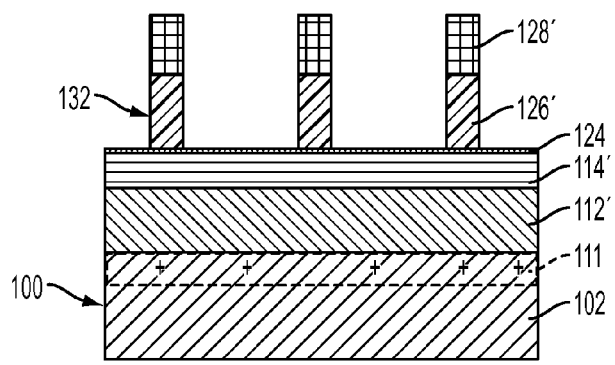
FIG. 18C is a cross-sectional view taken along line C-C' of the substrate illustrated in FIG. 18A showing a plurality of gate stacks formed on a fin and source/drain regions located adjacent each side of each gate stack.

Referring now to FIG. 18A, the exposed gate masking layer 128 is etched away and the gate mandrels 130' are removed. As illustrated in FIG. 18B, a portion of the oxide filler is exposed adjacent to the gate layer 126'. Referring to FIG. 18C, a plurality of gate stacks 132 is illustrated. Each gate stack 132 has a gate length and a gate width. The gate length extends in the X-axis direction to define a length-side, and the gate width extends in the Y-direction to define a width-side. The gate stacks 132 include a gate layer 126' and a gate mask 128' formed on an upper surface of the gate layer 126. The gate layer 126 is formed on the oxide filler 122, i.e., a buried oxide (BOX) layer, and extends across the fins 118. In addition, the removal of the masking layer 104 exposes the oxide filler 122 and the conformal oxide layer 124 covering the fins 118 as further illustrated in FIGS. 18A-18C.

Turning now to FIGS. 19A-26C, a process flow to form S/D elements on the semiconductor substrate 102 is illustrated.

Figure 19A:
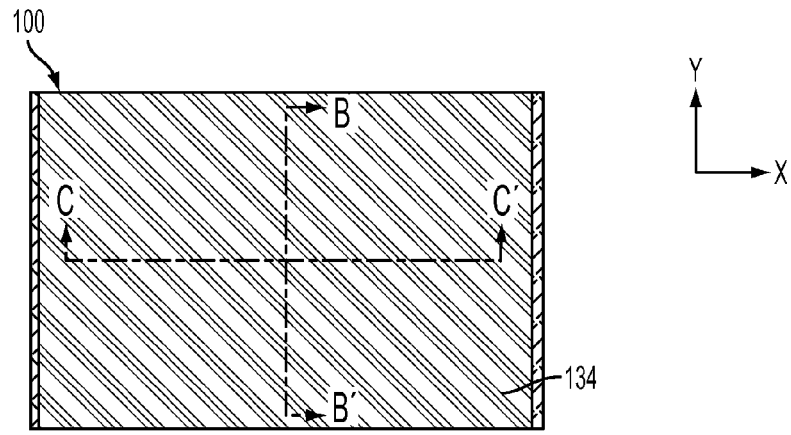
FIG. 19A is a top view of the substrate illustrated in FIGS. 18A-18C following deposition of a conformal spacer layer formed on the oxide filler and covering the plurality of gate stacks.
Figure 19B:
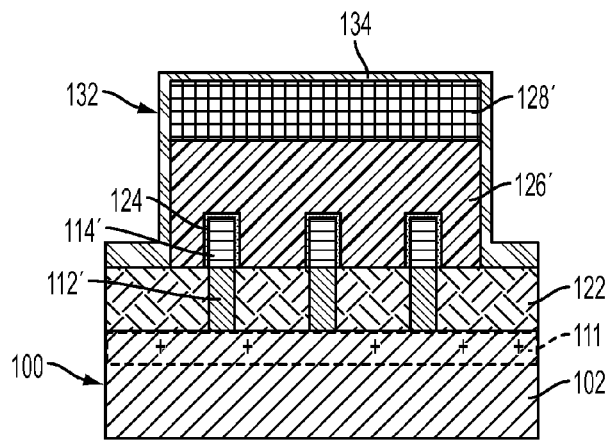
FIG. 19B is a cross-sectional view taken along line A-A' of the substrate illustrated in 19A showing the conformal spacer layer covering the gate stack.
Figure 19C:
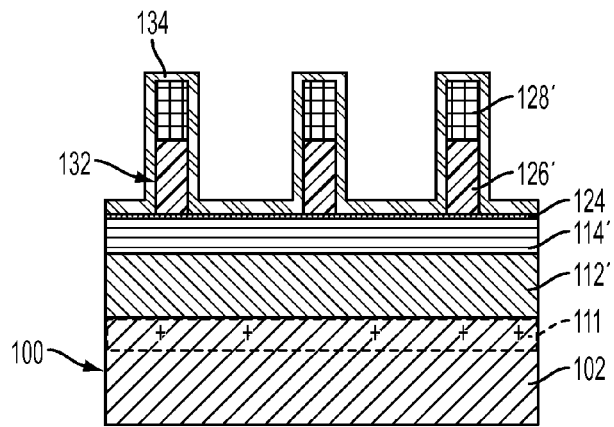
FIG. 19C is a cross-sectional view taken along line C-C' of the substrate illustrated in FIG. 19A showing the conformal spacer layer deposited between the individual gate stacks.

Referring to FIG. 19A, a gate spacer layer 134 is formed to cover the oxide filler 122, the fins 118 and the gate stacks 132. The gate spacer layer 134 may be formed from various materials including, but not limited to, SiN, which is annealed at a high temperature, for example approximately 1000 degrees Celsius (° C.), prior to performing the spacer etching process. FIG. 19B illustrates a cross-sectional view taken along line B-B' showing the gate spacer layer 134 formed on the oxide filler 122. FIG. 19C is a cross-sectional view taken along line C-C' showing the gate spacer layer 134 formed on individual gate stacks 132.

Figure 20A:
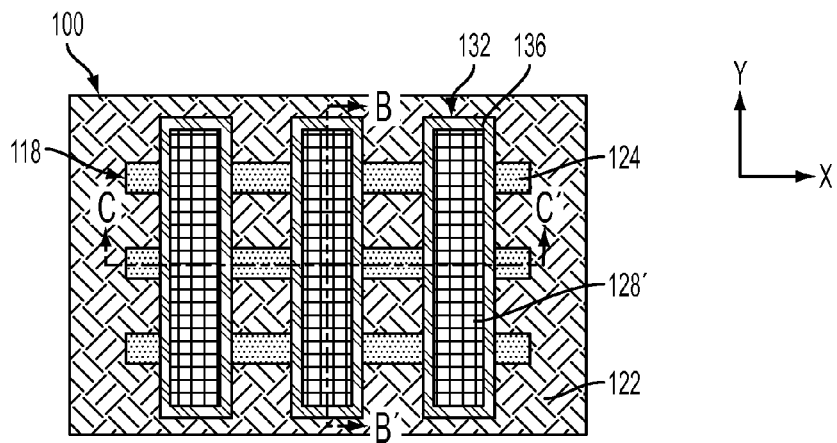
FIG. 20A is a top view of the substrate illustrated in FIGS. 19A-19C following removal of an upper portion of the spacer layer to expose the gate masks and etching of the spacer layer to define sidewalls of the gate stacks.
Figure 20B:
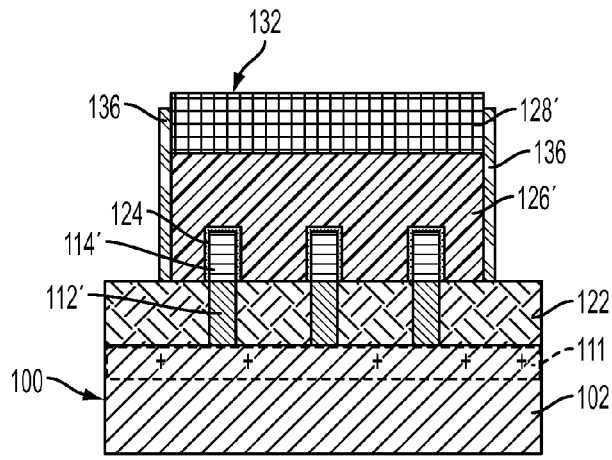
FIG. 20B is a cross-sectional view taken along line B-B' of the substrate illustrated in FIG. 20A illustrating sidewalls formed against a length-side of a gate stack.
Figure 20C:
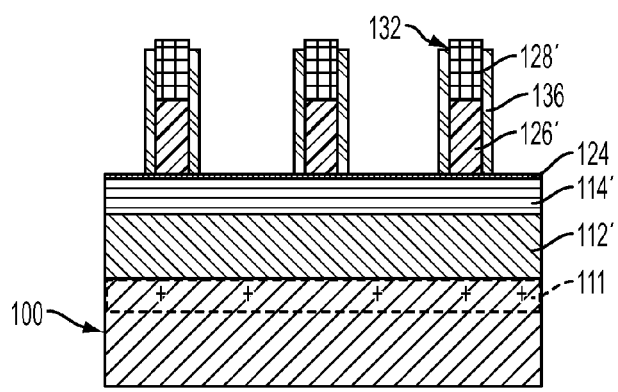
FIG. 20C is a cross-sectional view taken along line C-C' of the substrate illustrated in FIG. 20A illustrating sidewalls formed against a width-side of the plurality of gate stacks.

Referring to FIG. 20A, an upper portion of the gate spacer layer 134 is etched to expose the gate masking layer 128. FIG. 20B is a cross-sectional view taken along B-B' of the substrate 102, which illustrates sidewalls 136 formed against the sides of an individual gate stack 132 following etching of the gate spacer layer 134 shown in FIGS. 19A-19C. FIG. 20C is a cross-sectional view taken along C-C' of the substrate 102, which illustrates sidewalls 136 formed against the sides of each gate stack 132. In at least one embodiment, a plasma etching process is used to perform the spacer etching process. It is appreciated, however, that the spacer etching process is not limited to a plasma etching process. The sidewalls 136 may protect the gate stacks 132 during formation of S/D elements, which is discussed in greater detail below. The spacer etch process may also be performed at separate nFET regions and pFET regions. Accordingly, a series of block masks may be also be formed to cover the nFET regions and pFET regions during each respective spacer etching process as is understood by those of ordinary skill in the art.

Figure 21A:
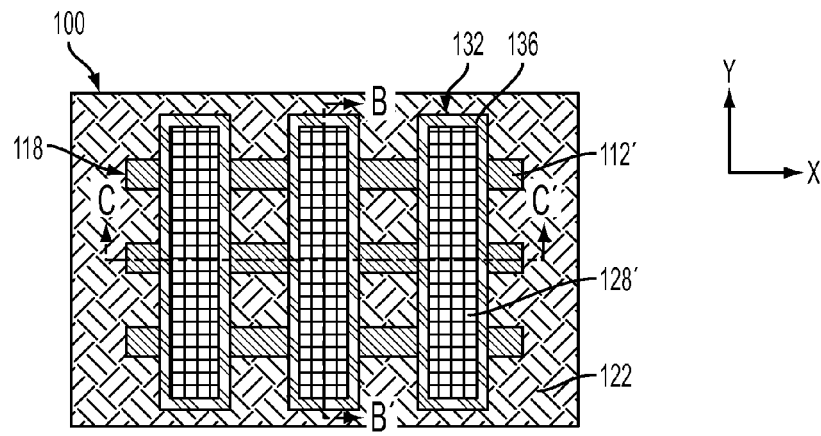
FIG. 21A is a top view of the substrate illustrated in FIGS. 20A-20C following removal of the conformal oxide layer and the active semiconductor layer at the source/drain regions to expose the sacrificial layer.
Figure 21B:
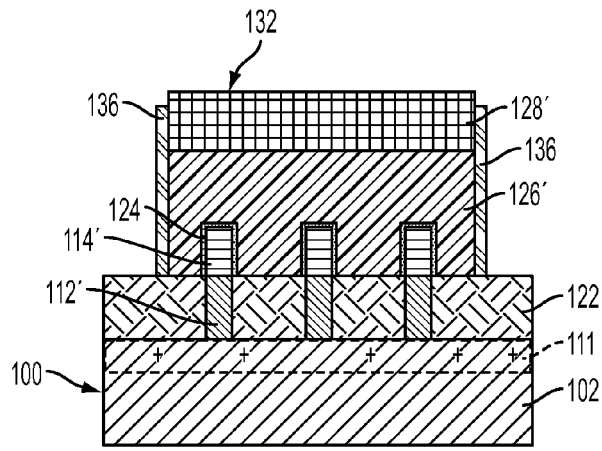
FIG. 21B is a cross-sectional view taken along line B-B' of the substrate illustrated in FIG. 21A.
Figure 21C:
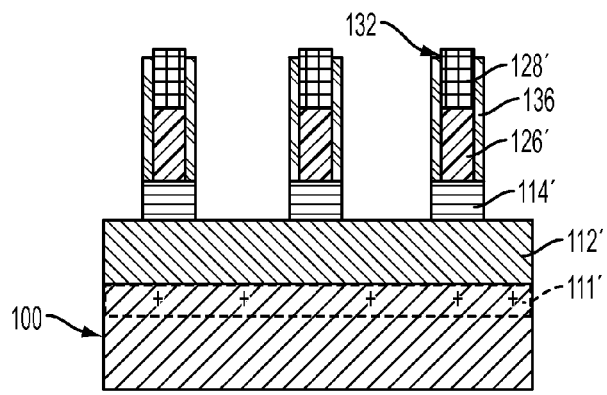
FIG. 21C is a cross-sectional view taken along line C-C' of the substrate illustrated in FIG. 21A showing the sacrificial layer exposed at the source/drain regions.

FIGS. 21A-21C, illustrates the substrate 102 following an etching process to remove a portion of the conformal oxide layer. Referring to FIG. 21C, for example, portions the conformal oxide layer 124 and the underlying Si fin layer located at the S/D regions 120 are selectively etched at regions adjacent to the sidewalls 136. Various etching processes may be used including, but not limited to, a plasma etching process. Accordingly, the underlying sacrificial oxide fin layer of the fins 118 located at the S/D regions 120 is exposed.

Figure 22A:
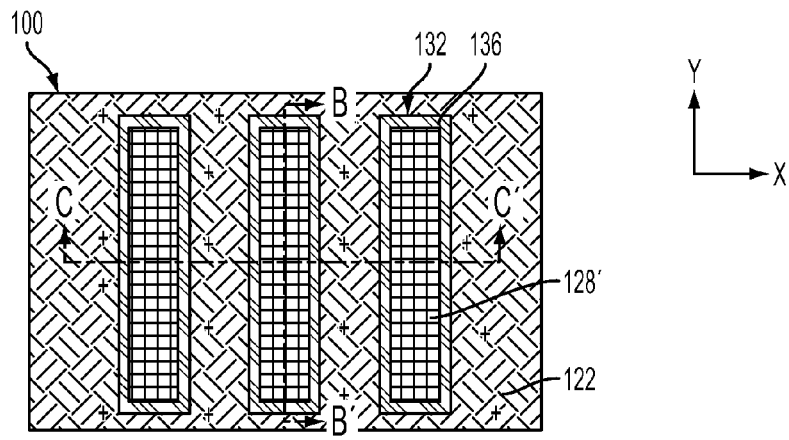
FIG. 22A is a top view of the substrate illustrated in FIGS. 21A-21C following etching of the sacrificial layer at the source/drain regions to expose a doped source/drain substrate region.
Figure 22B:
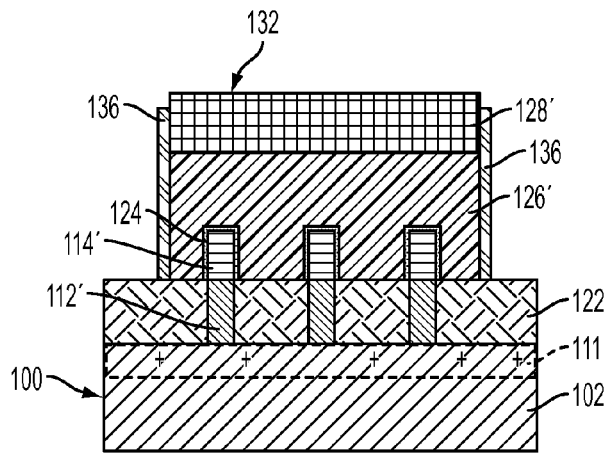
FIG. 22B is a cross-sectional view taken along line B-B' of the substrate illustrated in FIG. 22A.
Figure 22C:
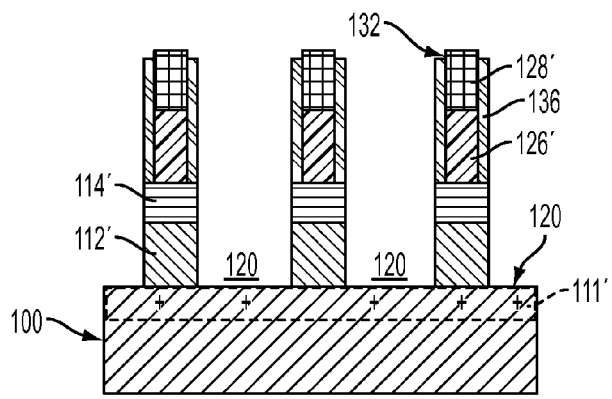
FIG. 22C is a cross-sectional view taken along line C-C' of the substrate illustrated in FIG. 22A showing doped source/drain regions between the gates.

Referring to FIGS. 22A-22C, the exposed sacrificial oxide fin layer located at the S/D regions 120 is further etched to expose the doped substrate at the S/D regions 120, i.e., the P+ doped S/D substrate regions 121. FIG. 22B illustrates a cross-section of the substrate 102 following a plasma etching process. The plasma etching process may be used to further etch the exposed sacrificial oxide fin layer. Referring to FIGS. 22B-22C, a doped S/D substrate region is formed between each gate stack 132. In at least one embodiment, the exposed doped S/D substrate region 121 is formed having a crystal orientation, i.e., a Miller Index of <100>.

Figure 23A:
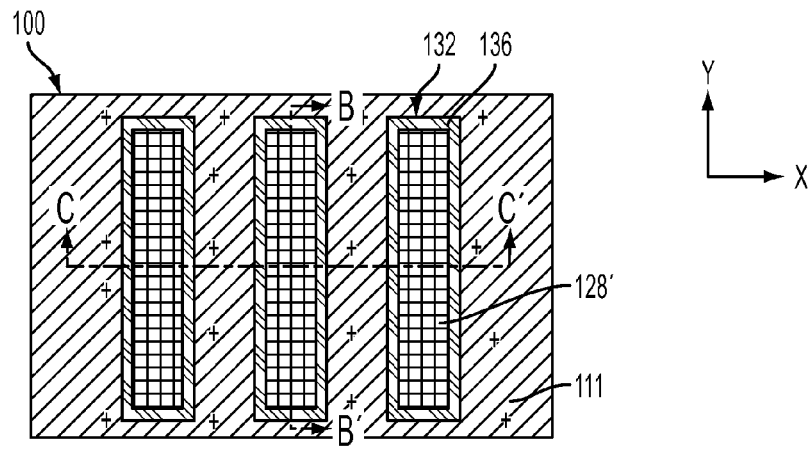
FIG. 23A is top view of the substrate illustrated in FIGS. 22A-22C following removal of the sacrificial oxide fin layer.
Figure 23B:
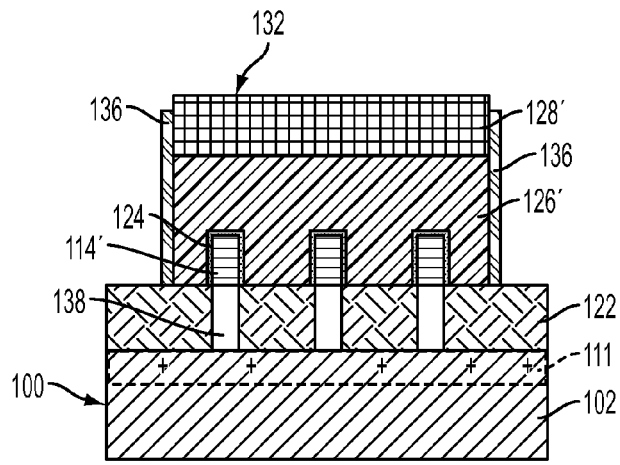
FIG. 23B is a cross-sectional view taken along line B-B' of the substrate illustrated in FIG. 23A showing fin voids formed between the active semiconductor fin layer of each fin and the doped substrate layer.
Figure 23C:
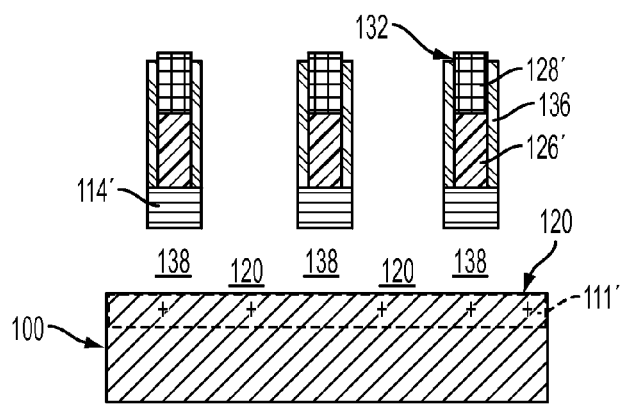
FIG. 23C is a cross-sectional view taken along line C-C' of the substrate illustrated in FIG. 23A showing a fin void extending between the oxide filler of each gate stack and the doped substrate layer.

Turning to FIGS. 23A-23C, the sacrificial oxide fin layer is removed from the fins 118. Referring to FIGS. 22B-23C, for example, a fin void 138 is formed between the doped semiconductor substrate 102 and the Si fin layer. The gate stack 132 remains in contact with the oxide filler 122. Accordingly, even though the sacrificial oxide fin layer is removed the Si layer of the fins 118 remains supported based on their contact with the gate layer 126 of the gate stack 132.

Figure 24A:
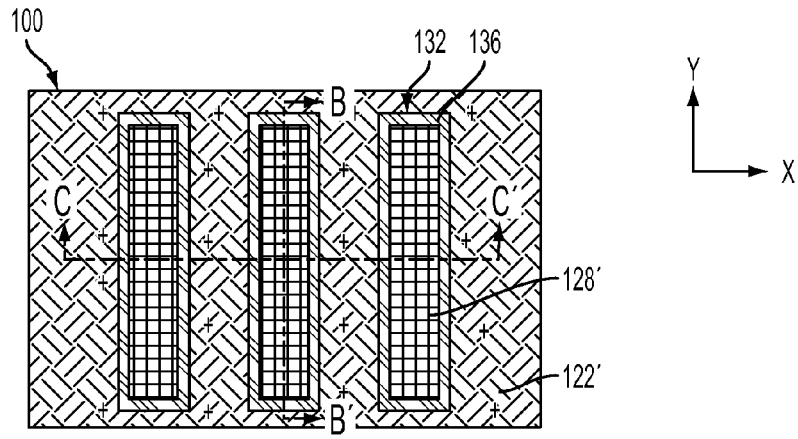
FIG. 24A is a top view of the substrate illustrated in FIGS. 23A-23C after depositing an oxide filler in the fin voids and on the exposed doped source/drain regions to surround the gate stacks.
Figure 24B:
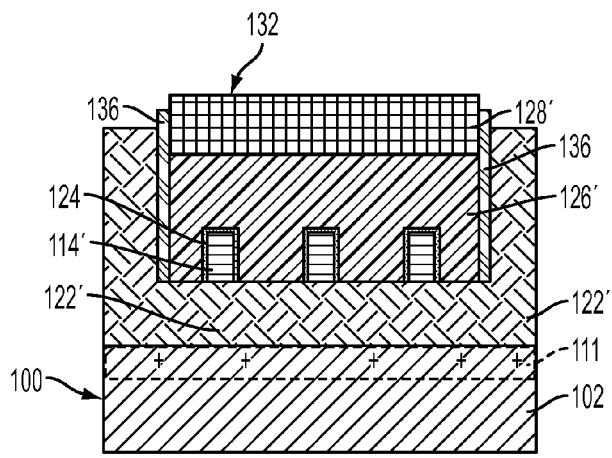
FIG. 24B is a cross-sectional view taken along line B-B' of the substrate illustrated in FIG. 24A showing the oxide filler deposited in the fin voids and against the sidewalls of the gate stack.
Figure 24C:
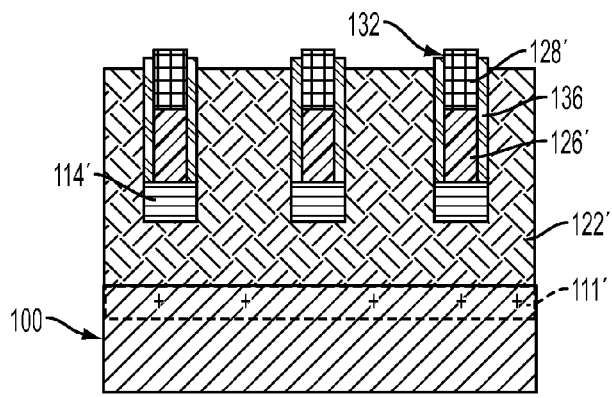
FIG. 24C is a cross-sectional view taken along line C-C' of the substrate illustrated in FIG. 24A showing the oxide filler deposited in the fin void and on the doped source/drain regions.

The fin void 138 may then be back-filled with a second oxide filler 122' as illustrated in FIGS. 24A-24C. FIG. 24B illustrates the second oxide filler 122' being formed below the top of the gate masking. It is appreciated, however, that the second oxide filler 122' may cover the entire upper portion of the semiconductor device, i.e., by extend above the gate masking. The second oxide filler 122' may be made of the same material comprising the oxide filler 122 contacting the gate stack 132. The second oxide filler may include a flowable oxide material. Referring to FIGS. 24B-24C, the fins 118 may be integrally formed with the oxide filler, i.e., the oxide substrate layer contacting the gate stack 132.

Figure 25A:
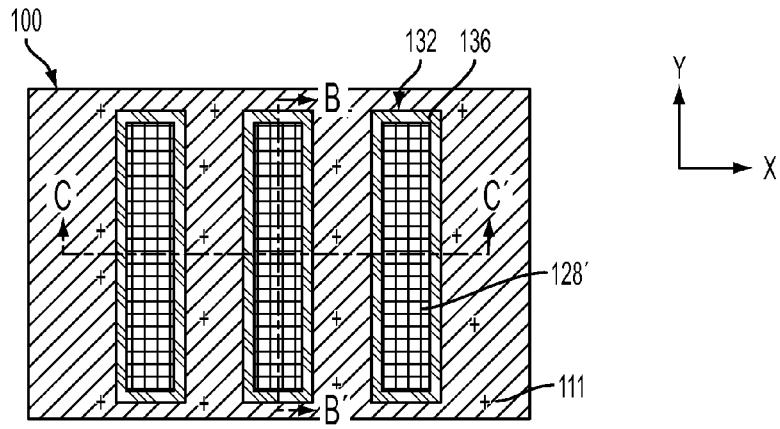
FIG. 25A is a top view of the substrate illustrated in FIGS. 24A-24C following an etching process to re-expose the doped substrate layer.
Figure 25B:
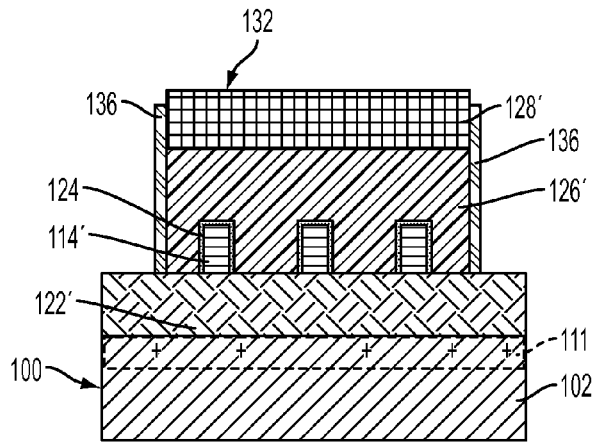
FIG. 25B is a cross-sectional view taken along line B-B' of the substrate illustrated in FIG. 25A showing the exposed doped source/drain regions adjacent the length-sides of the gate stack.
Figure 25C:
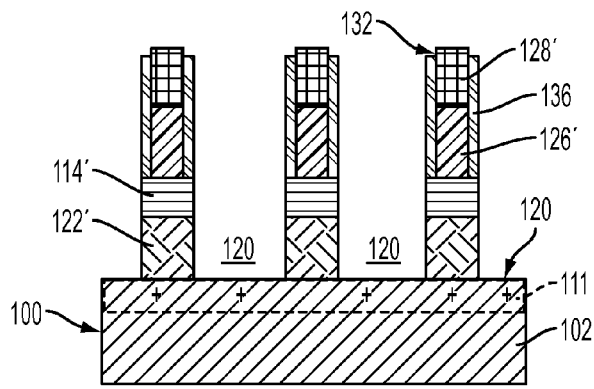
FIG. 25C is a cross-sectional view taken along line C-C' of the substrate illustrated in FIG. 25A showing the exposed doped source/drain regions between the length of each gate stack.

Turning now to FIGS. 25A-25C, the second oxide filler 122' may be recessed to again expose the doped S/D substrate regions 121 between each gate stack 132. The exposed doped S/D substrate regions 121 may be utilized as a seeding layer to epitaxially grow S/D elements 140 at the S/D regions 120. The S/D elements 140 include ions having a second polarity that is opposite the first polarity of the doped S/D substrate region 121. The exposed doped S/D substrate regions 121 may be doped, for example, with positive (+) ions, as further illustrated in FIGS. 25A-25C.

Figure 26A:
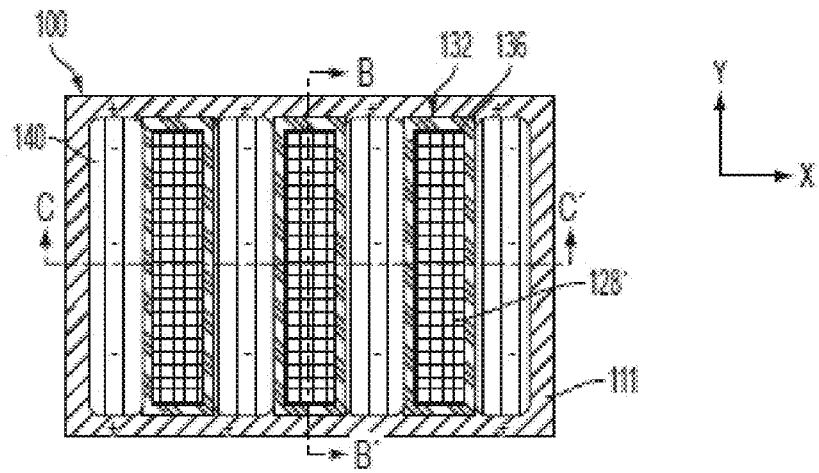
FIG. 26A is a top view of the substrate illustrated in FIGS. 25A-25C following formation of source/drain elements on the exposed doped source/drain regions.
Figure 26B:
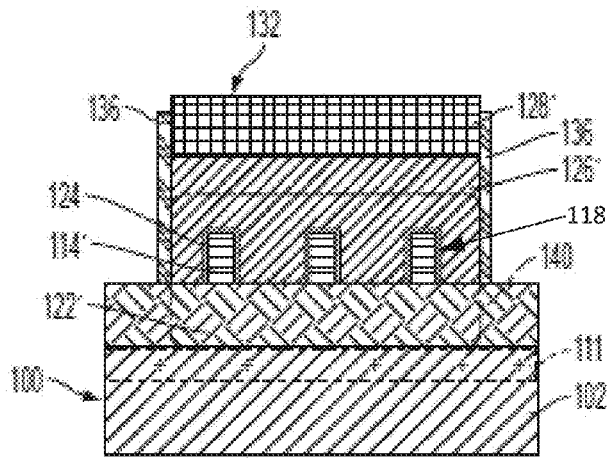
FIG. 26B is a cross-sectional view taken along line B-B' of the substrate illustrated in FIG. 26A showing a source/drain element in phantom.
Figure 26C:
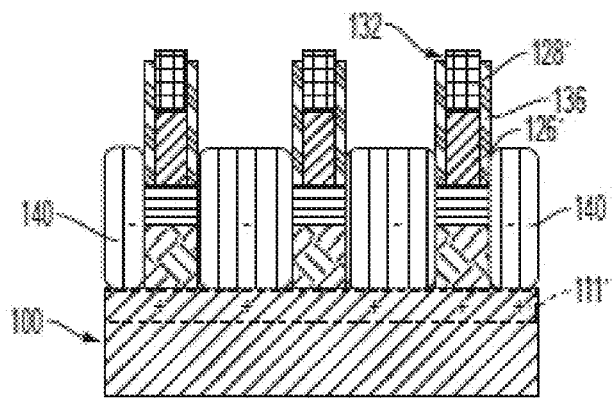
FIG. 26C is a cross-sectional view taken along line C-C' of the substrate illustrated in FIG. 26A showing source/drain elements formed on the doped source/drain regions and against the sides of each gate stack.

Referring to FIGS. 26A-26C, an N-doped material may be epitaxially grown from the exposed doped S/D substrate regions 121 to form S/D elements 140 being doped with negative (−) ions. In at least one embodiment, each S/D elements 140 is formed against the gate stack 132, and directly contacts the semiconductor substrate 102, i.e., the doped S/D substrate region 121 of the semiconductor substrate 102. The top surface of the S/D elements 140 may be flush with the top surface of a respective fin. In another embodiment, the top surface of the S/D elements 140 may extend above an upper portion of a respective fin 118 by a distance ranging from approximately 0.2 nm to approximately 50 nm. Further the thickness of the fin oxide layer of the fin 118, i.e., the layer of the fin 118 interposed between the active Si layer 114' and the doped substrate area 111, may be varied by controlling the thickness of the sacrificial oxide layer 112 formed in FIGS. 5A-5B.

Figure 27A:
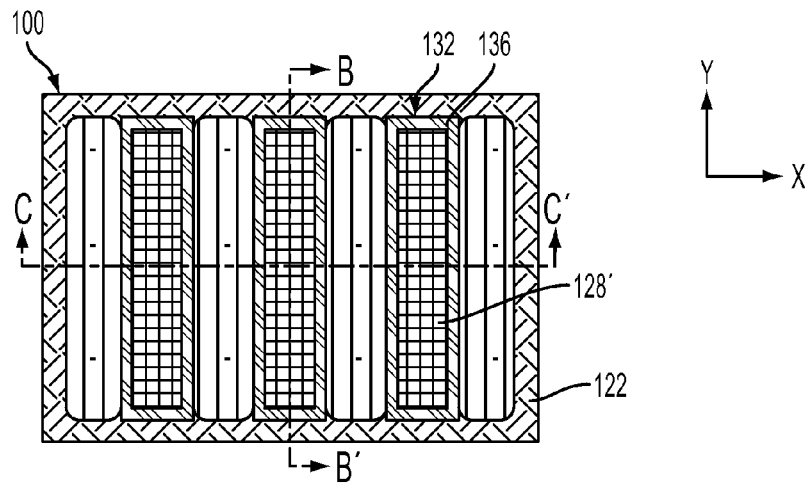
FIG. 27A is a top view of the substrate illustrated in FIGS. 26A-26B following deposition of an oxide filler on the exposed doped substrate layer.
Figure 27B:
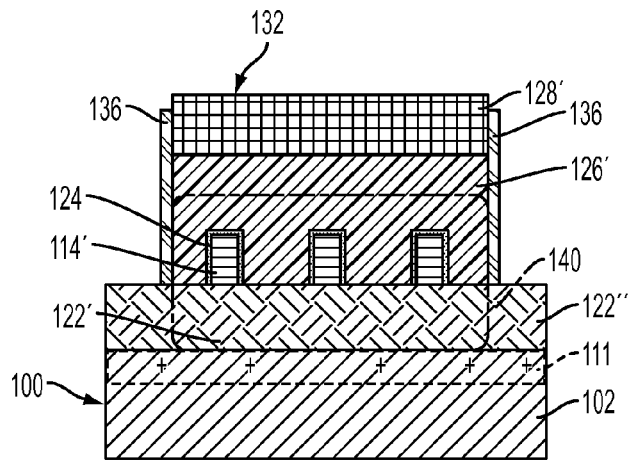
FIG. 27B is a cross-sectional view taken along line B-B' of the substrate illustrated in FIG. 27A.
Figure 27C:
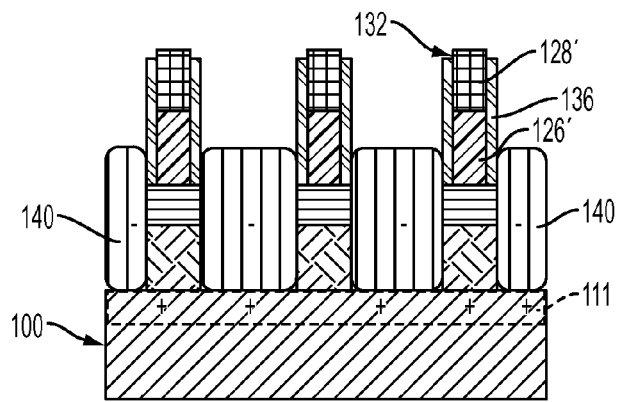

Referring to FIGS. 27A-27C, the semiconductor substrate 102 may be back-filled with a third oxide filler 122" to cover the exposed doped substrate area 111. The third oxide filler 122" may include a flowable oxide material. Additional processes may be applied to the semiconductor device 102 including, but not limited to, dummy gate removal, metal gate replacement, metal gate capping formation, metal gate contact stack layer formation, contact via/trench formation to connect the S/D elements 140, S/D element silicide formation, metal gate contact formation to form an electrical conductive contact at the metal gate, metal filling of the S/D and gate via/trenches, and back end of line (BEOL) wiring processes to interconnect various electrical devices formed on the semiconductor device.

Figure 28:
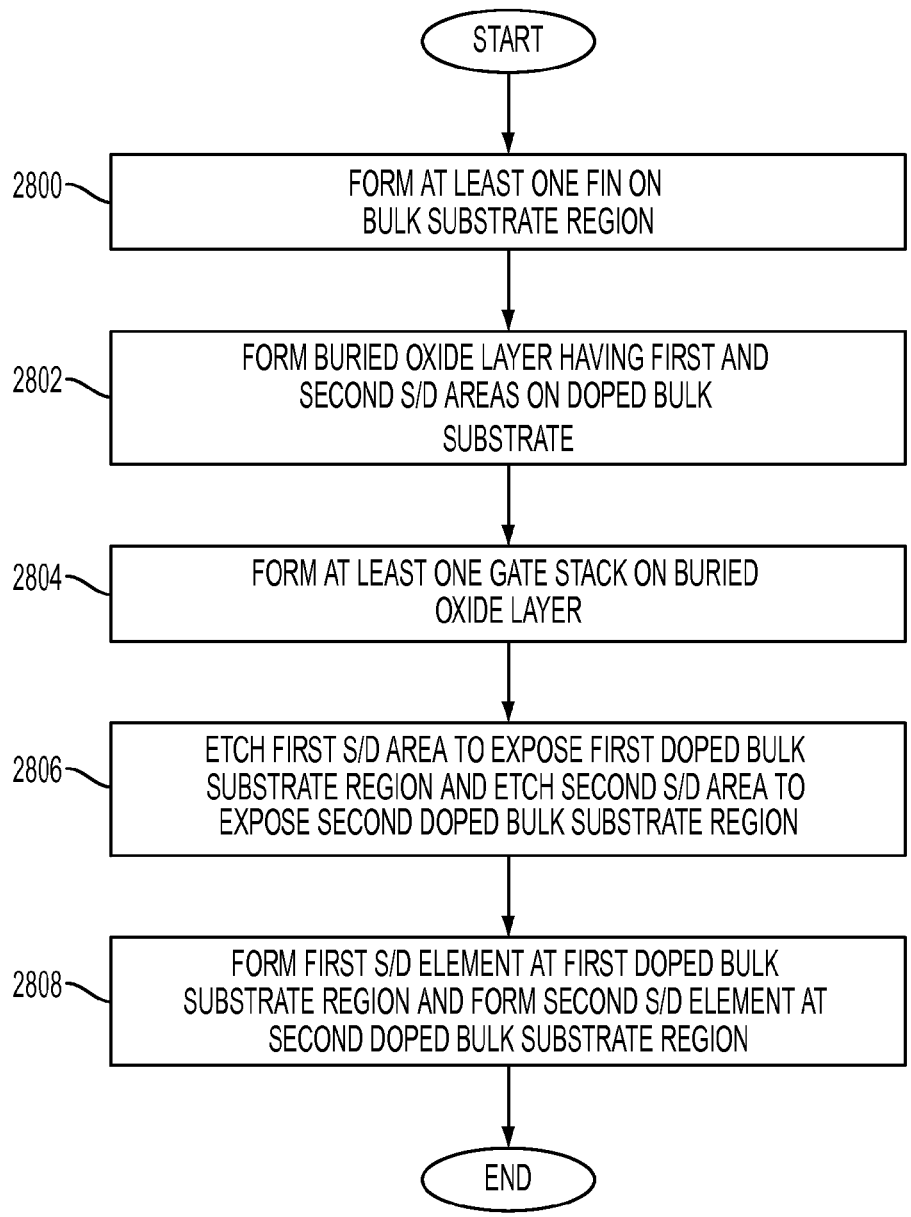
FIG. 28 is a flow diagram illustrating a method of forming a semiconductor device according to an exemplary embodiment of the invention.

Turning now to FIG. 28, a flow diagram illustrates a method of forming a semiconductor device according to an exemplary embodiment of the invention. At operation 2800, a process of forming at least one fin on a doped bulk substrate region of a semiconductor substrate is performed. At operation 2802, a process of forming a buried oxide layer on the doped bulk substrate region to surround the at least one fin, the buried oxide layer having a first source/drain region and a second source/drain region is performed. At operation 2804, a process of forming at least one gate stack on the buried oxide layer is performed. At operation 2806, a process of etching the first and second source/drain areas to expose respective first and second doped bulk substrate regions is performed. At operation 2808, a process of forming a first source/drain element at the first doped bulk substrate region and forming a second source/drain element at the second doped bulk substrate region is performed, and the method ends.

Accordingly, by forming S/D elements on the bulk portion of the semiconductor substrate, i.e., the doped S/D substrate regions, while forming the gate on the oxide filler, i.e., the BOX layer, erosion of the fins during spacer etch may be avoided and non-merged fins at the epi module may be eliminated. Further, providing a doped S/D substrate region where the crystal orientation has a Miller Index of <100> increases the film quality, thereby reducing source/drain epitaxial defects. In addition, forming S/D elements on the doped S/D substrate regions, while forming the gate on the buried oxide filler minimizes source/drain electrical punch-through and prevents cross-talk between nFET portions and pFET portions.

The terminology used herein is for the purpose of describing exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The flow diagrams depicted herein are just one example. There may be many variations to this diagram or operations described therein without departing from the spirit of the invention. For instance, the operations may be performed in a differing order or operations may be added, deleted or modified. All of these variations are considered a part of the claims.

While exemplary embodiments to the present invention have been described, it will be understood that those skilled in the art, both now and in the future, may make various changes which fall within the scope of the claims described below.

The invention claimed is:

1. A semiconductor device, comprising:
   a doped substrate layer formed on a substrate portion of the semiconductor device, the doped substrate layer extending along a first direction to define a length and a second direction perpendicular to the first direction to define a width;

a plurality of fins formed on the doped substrate layer;
an oxide substrate layer formed between each fin among the plurality of fins; and
at least one gate formed on the oxide substrate layer and extending across at least one fin among the plurality of fins,
wherein the doped substrate layer has a plurality of source/drain regions separated from one another by a corresponding fin, and wherein a doped epitaxial source and drain element is formed on each source/drain region and disposed adjacent to at the least one gate among,
wherein the plurality of fins includes an oxide fin layer formed directly on the doped substrate layer and a silicon fin layer formed on the oxide fin layer, the oxide fin layer being formed of the same material as the oxide substrate layer, and
wherein the doped epitaxial source and drain element is doped with first ions having a first polarity and the source/drain region is doped with second ions having a second polarity opposite from the first polarity.

2. The semiconductor device of claim 1, wherein a top of the doped epitaxial source and drain element extends beyond a top of the plurality of fins.

3. The semiconductor device of claim 2, wherein the doped substrate layer is formed from silicon.

* * * * *